(12) United States Patent
Liu et al.

(10) Patent No.: US 12,396,242 B2
(45) Date of Patent: Aug. 19, 2025

(54) NANO-STRUCTURE TRANSISTORS WITH AIR INNER SPACERS AND METHODS FORMING SAME

(71) Applicant: Taiwan Semiconductor Manufacturing Co., Ltd., Hsinchu (TW)

(72) Inventors: Wei-Min Liu, Hsinchu (TW); Cheng-Yen Wen, Taichung (TW); Li-Li Su, Chubei (TW); Chii-Horng Li, Zhubei (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 433 days.

(21) Appl. No.: 17/662,930

(22) Filed: May 11, 2022

(65) Prior Publication Data

US 2023/0187524 A1    Jun. 15, 2023

Related U.S. Application Data

(60) Provisional application No. 63/289,707, filed on Dec. 15, 2021.

(51) Int. Cl.
| | |
|---|---|
| *H10D 64/66* | (2025.01) |
| *H01L 21/02* | (2006.01) |
| *H01L 21/28* | (2006.01) |
| *H10D 30/01* | (2025.01) |
| *H10D 30/67* | (2025.01) |

(Continued)

(52) U.S. Cl.
CPC ....... *H10D 64/679* (2025.01); *H01L 21/0259* (2013.01); *H01L 21/28123* (2013.01); *H10D 30/031* (2025.01); *H10D 30/6735* (2025.01); *H10D 30/6757* (2025.01); *H10D 62/118* (2025.01); *H10D 64/018* (2025.01)

(58) Field of Classification Search
None
See application file for complete search history.

(56) References Cited

U.S. PATENT DOCUMENTS

| | | |
|---|---|---|
| 10,177,227 B1 | 1/2019 | Yoshida et al. |
| 11,670,680 B2 | 6/2023 | Jung et al. |
| 11,670,723 B2 | 6/2023 | Huang et al. |

(Continued)

FOREIGN PATENT DOCUMENTS

| | | |
|---|---|---|
| KR | 20190024535 A | 3/2019 |
| KR | 20190024740 A | 3/2019 |

(Continued)

*Primary Examiner* — Anthony Ho
(74) *Attorney, Agent, or Firm* — Slater Matsil, LLP

(57) ABSTRACT

A method includes forming a stack of layers, which includes a plurality of semiconductor nano structures and a plurality of sacrificial layers. The plurality of semiconductor nano structures and the plurality of sacrificial layers are arranged alternatingly. The method further includes laterally recessing the plurality of sacrificial layers to form lateral recesses, forming inner spacers in the lateral recesses, and epitaxially growing a source/drain region from the plurality of semiconductor nano structures. The source/drain region is spaced apart from the inner spacers by air inner spacers.

20 Claims, 30 Drawing Sheets

(51) Int. Cl.
  *H10D 62/10*     (2025.01)
  *H10D 64/01*     (2025.01)

(56) References Cited

U.S. PATENT DOCUMENTS

| | | |
|---|---|---|
| 2018/0331232 A1 | 11/2018 | Frougier et al. |
| 2019/0067441 A1 | 2/2019 | Yang et al. |
| 2020/0365692 A1* | 11/2020 | Jung .................. H01L 29/0673 |
| 2020/0381531 A1 | 12/2020 | Chung et al. |
| 2021/0273103 A1 | 9/2021 | Chen et al. |

FOREIGN PATENT DOCUMENTS

| | | |
|---|---|---|
| KR | 20200132436 A | 11/2020 |
| KR | 20210080308 A | 6/2021 |
| KR | 20210139125 A | 11/2021 |

* cited by examiner

NANO-STRUCTURE TRANSISTORS WITH AIR INNER SPACERS AND METHODS FORMING SAME

PRIORITY CLAIM AND CROSS-REFERENCE

This application claims the benefit of the following provisionally filed U.S. patent application: Application No. 63/289,707, filed on Dec. 15, 2021, and entitled "Nanosheet FETs with Air Inner Spacer," which application is hereby incorporated herein by reference.

BACKGROUND

In the formation of nano-structure transistors, inner spacers are formed to isolate the epitaxy source/drain regions from gate stacks, which are formed between the stacked nano semiconductor layers. The inner spacers are formed of dielectric materials. The epitaxy regions are grown from the stacked nano semiconductor layers. In addition, some epitaxy growth may also occur from the inner spacers, resulting in a high density of defects, which adversely affect the performance of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
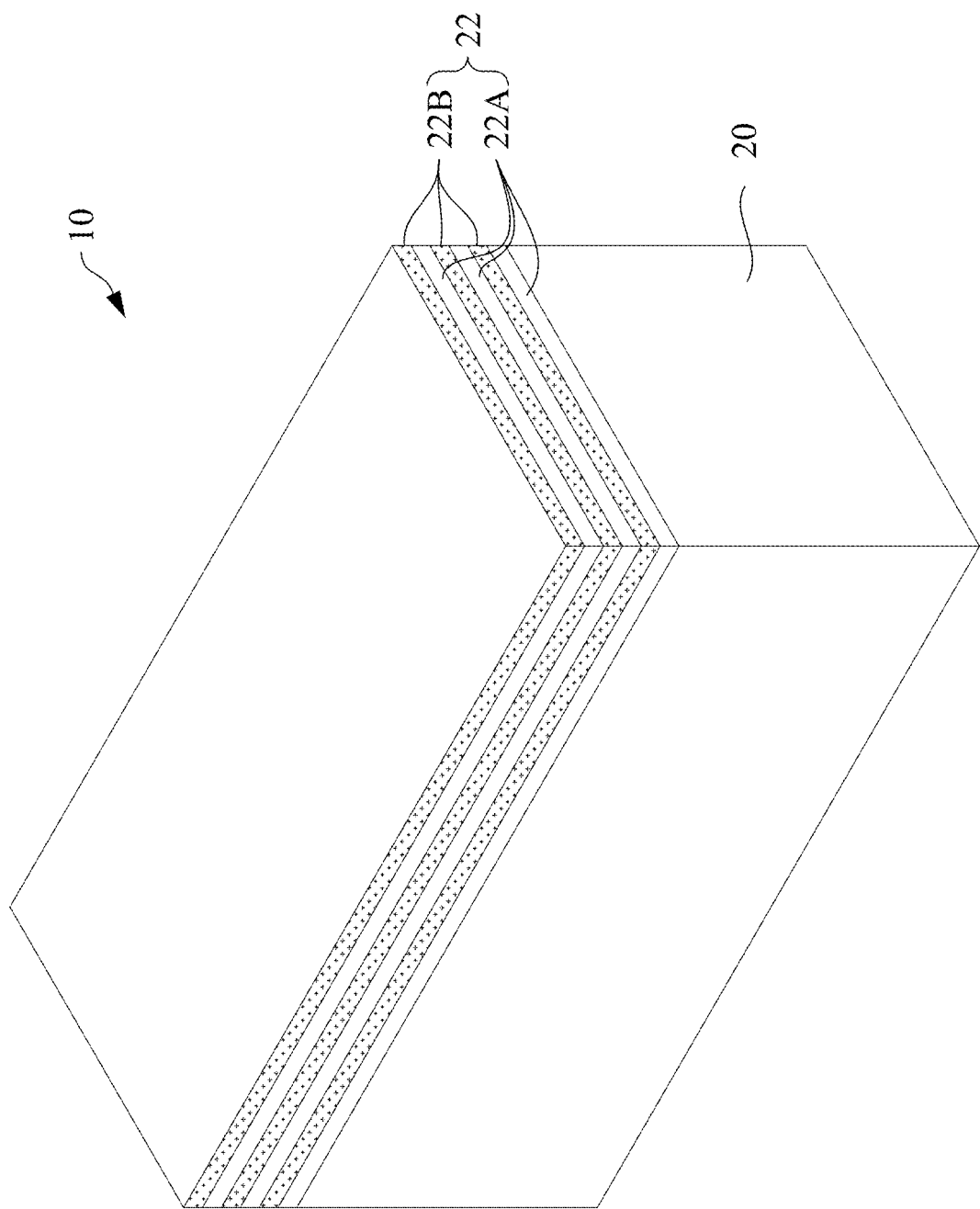
FIGS. 1-4, 5A, 5B, 6A, 6B, 7A, 7B, 8A, 8B, 9A, 9B, 9C, 10A, 10B, 11A, 11B, 11C, 12A, 12B, 13A, 13B, 14A, and 14B illustrate the cross-sectional views of intermediate stages in the formation of a Gate All-Around (GAA) transistor including air inner spacers in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Gate All-Around (GAA) transistor having an air inner spacer is provided. The method of forming the GAA transistor is also provided. In accordance with some embodiments, a dielectric inner spacer is formed next to a sacrificial layer. Epitaxy regions are grown from semiconductor layers overlying and underlying the sacrificial layer, and are merged, so that an air inner spacer is formed between the merged epitaxy regions and the dielectric inner spacer. With the air inner spacer being formed, the epitaxy regions have fewer defects, and the performance of the resulting GAA transistor is improved. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 29:
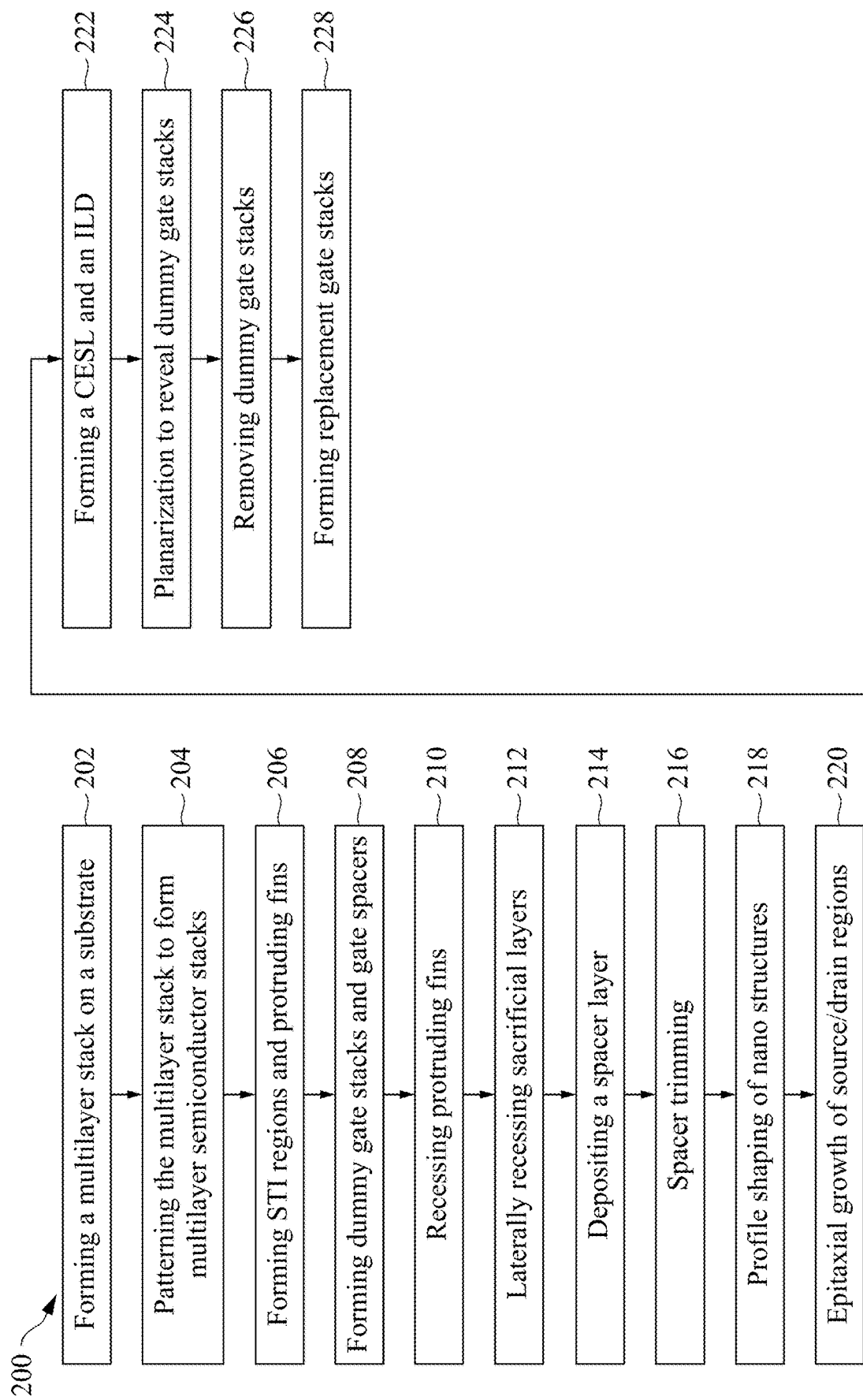
FIG. 29 illustrates a process flow for forming a GAA transistor having air inner spacers in accordance with some embodiments.

FIGS. 1-4, 5A, 5B, 6A, 6B, 7A, 7B, 8A, 8B, 9A, 9B, 9C, 10A, 10B, 11A, 11B, 11C, 12A, 12B, 13A, 13B, 14A, and 14B illustrate the cross-sectional views of intermediate stages in the formation of a GAA transistor including air inner spacers in accordance with some embodiments of the present disclosure. The corresponding processes are also reflected schematically in the process flow shown in FIG. 29.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

In accordance with some embodiments, multilayer stack 22 is formed through a series of deposition processes for depositing alternating materials. The respective process is illustrated as process 202 in the process flow 200 shown in FIG. 29. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A. In accordance with some embodiments, the second layer 22B may be formed to a second thickness in the range between about 10 Å and about 500 Å, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B.

In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, there are some pad oxide layer(s) and hard mask layer(s) (not shown) formed over multilayer stack 22. These layers are patterned, and are used for the subsequent patterning of multilayer stack 22.

Figure 2:
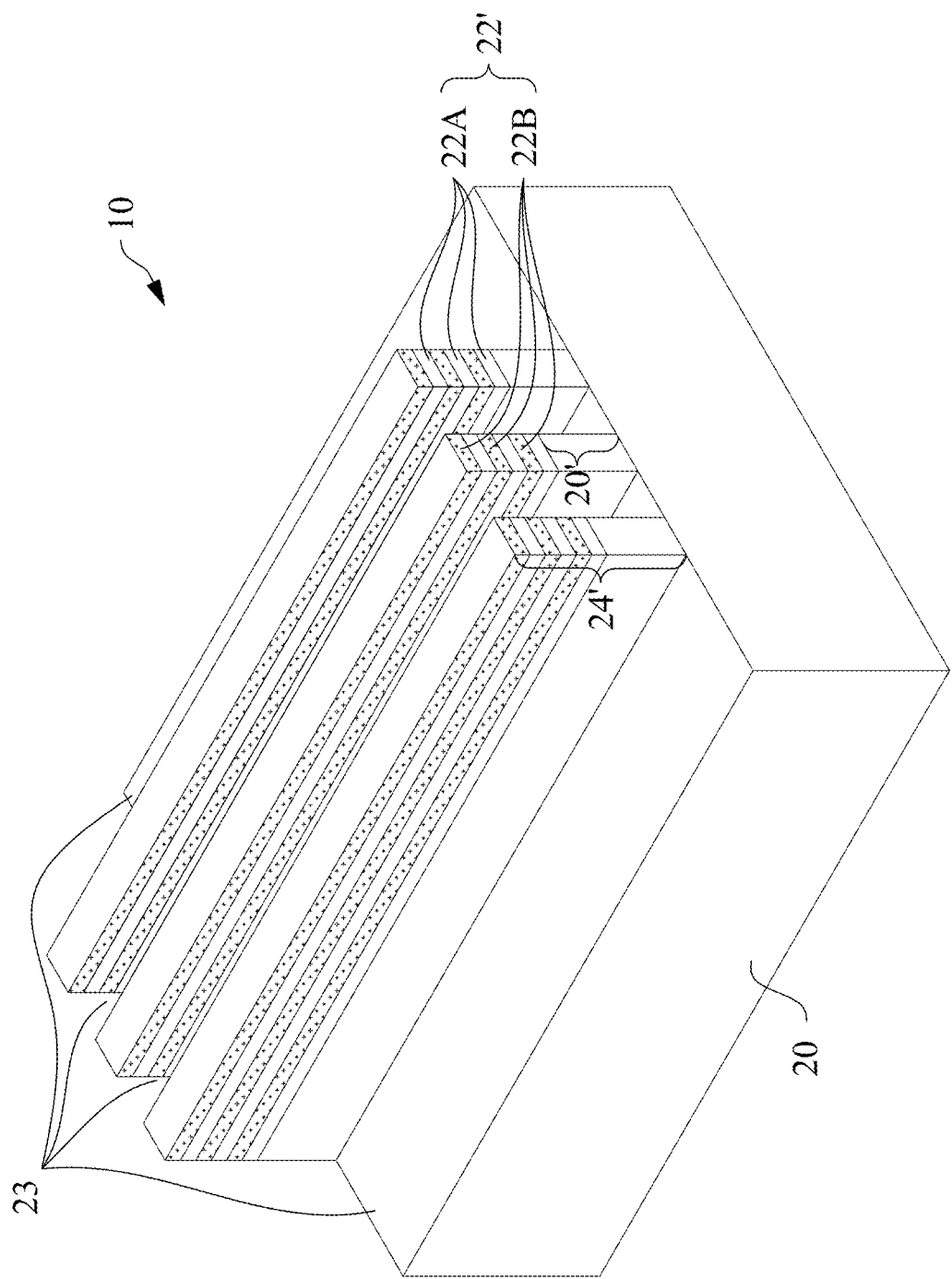

Referring to FIG. 2, multilayer stack 22 and a portion of the underlying substrate 20 are patterned in an etching process(es), so that trenches 23 are formed. The respective process is illustrated as process 204 in the process flow 200 shown in FIG. 29. Trenches 23 extend into substrate 20. The remaining portions of multilayer stacks are referred to as multilayer stacks 22' hereinafter. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
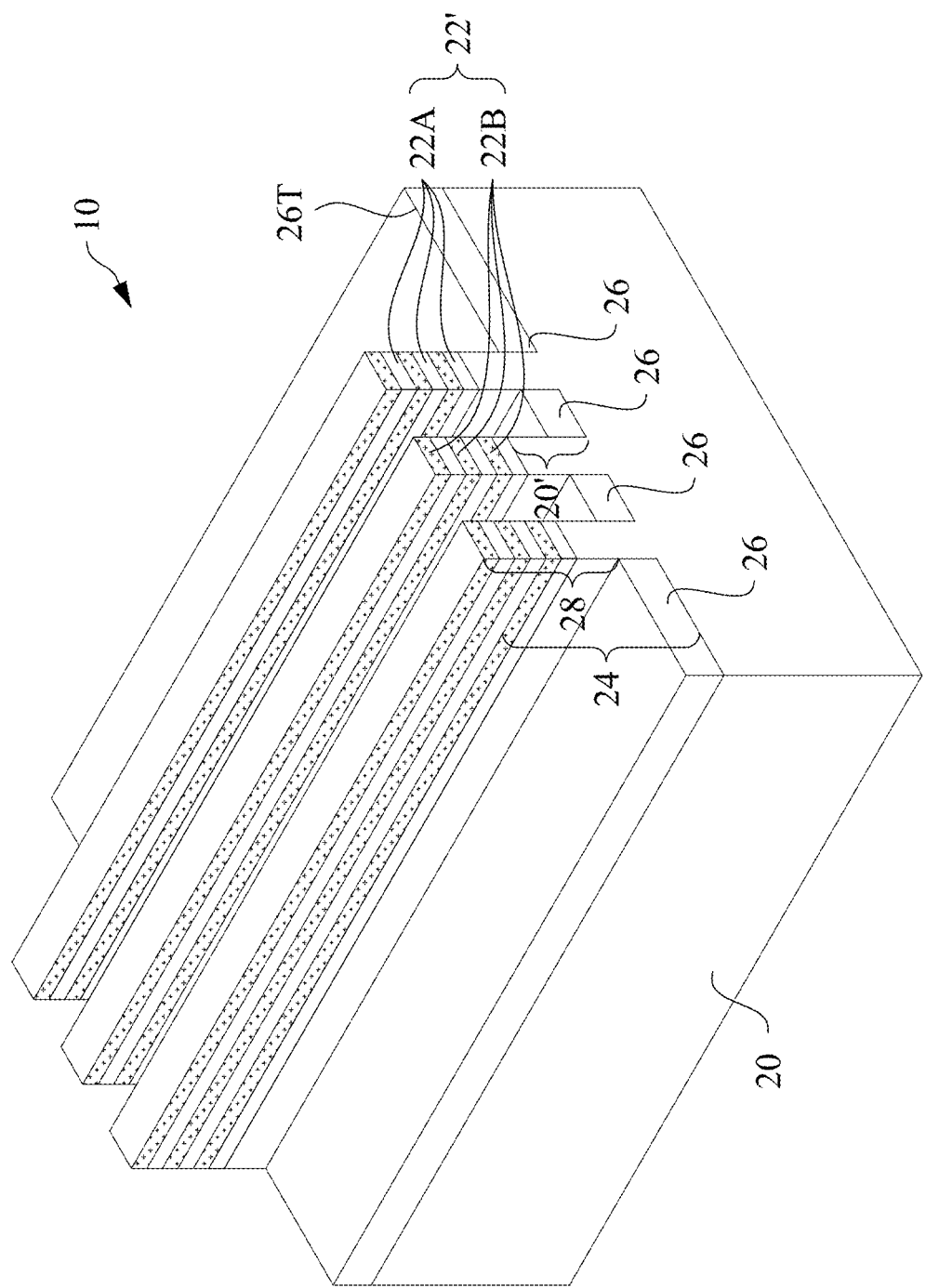

FIG. 3 illustrates the formation of isolation regions 26, which are also referred to as Shallow Trench Isolation (STI) regions throughout the description. The respective process is illustrated as process 206 in the process flow 200 shown in FIG. 29. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multilayer stacks 22' and the top portions of substrate strips 20'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
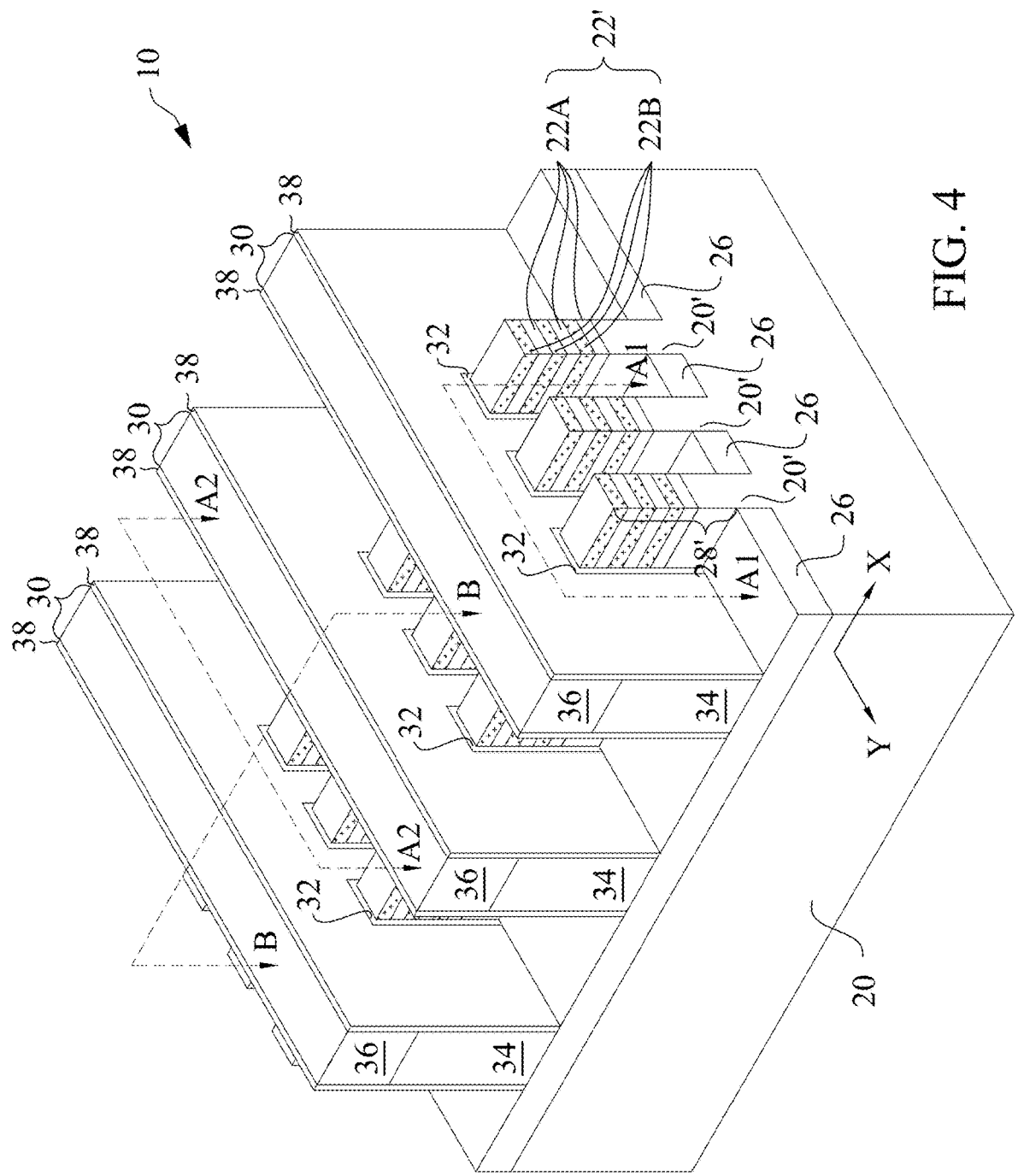

Referring to FIG. 4, dummy gate stacks 30 and gate spacers 38 are formed on the top surfaces and the sidewalls of (protruding) fins 28. The respective process is illustrated as process 208 in the process flow 200 shown in FIG. 29. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers, or by depositing a dielectric layer such as a silicon oxide layer. Dummy gate electrodes 34 may be formed, for example, using polysilicon or amorphous silicon, and other materials such as amorphous carbon may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. Dummy gate stacks 30 may cross over a single one or a plurality of protruding fins 28 and the STI regions 26 between protruding fins 28. Dummy gate stacks 30 also have lengthwise directions perpendicular to the lengthwise directions of protruding fins 28. The formation of dummy gate stacks 30 includes forming a dummy gate dielectric layer, depositing a dummy gate electrode layer over the dummy gate dielectric layer, depositing one or more hard mask layers, and then patterning the formed layers through a patterning process(es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

Figure 5B:
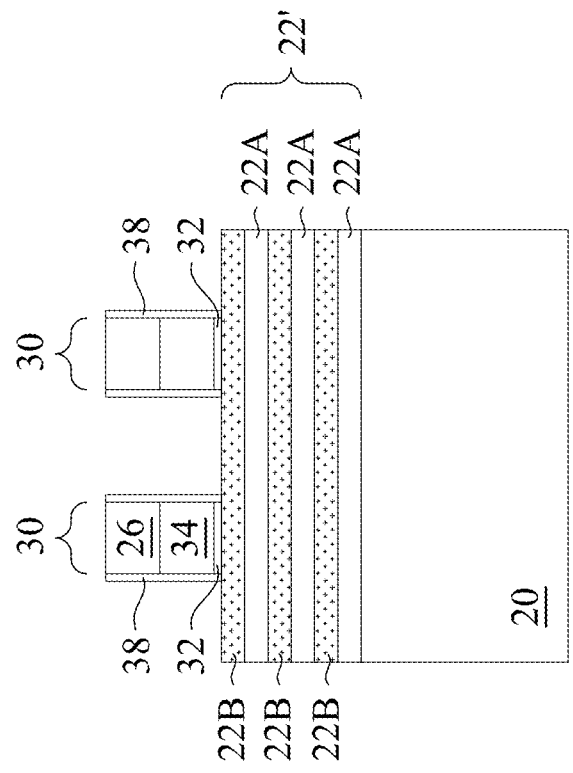
Figure 5A:
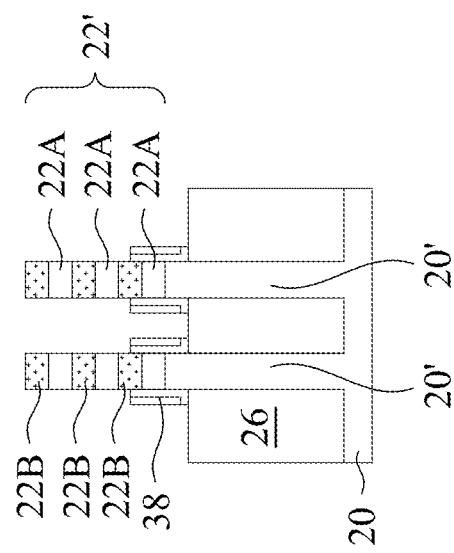

FIGS. 5A and 5B illustrate the cross-sectional views of the structure shown in FIG. 4. FIG. 5A illustrates the reference cross-section A1-A1 in FIG. 4, which cross-section cuts through the portions of protruding fins 28 not covered by gate stacks 30 and gate spacers 38, and is perpendicular to the gate-length direction. Fin spacers 38, which are on the sidewalls of protruding fins 28, are also illustrated. FIG. 5B illustrates the reference cross-section B-B in FIG. 4, which reference cross-section is parallel to the lengthwise directions of protruding fins 28.

Figure 6B:
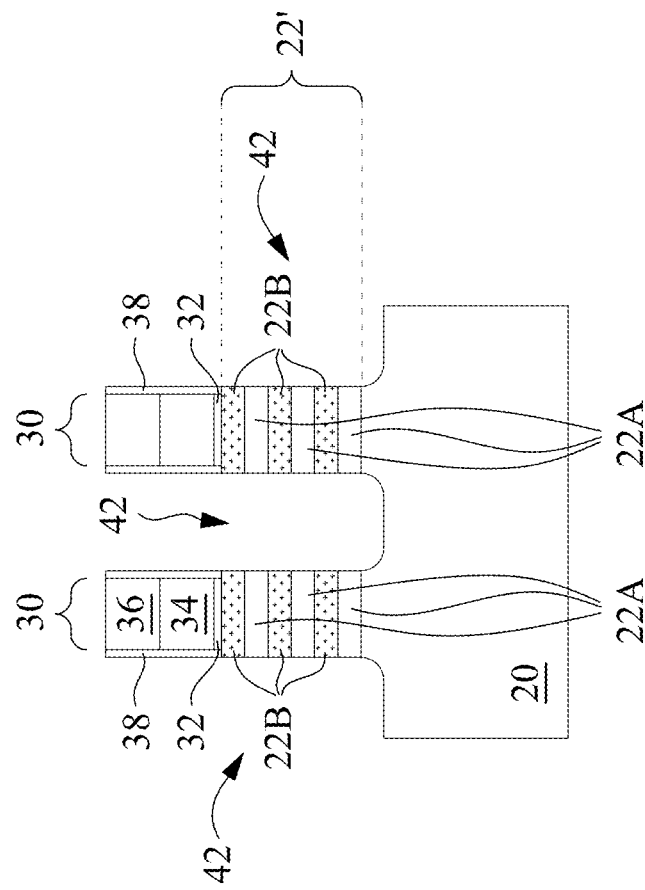
Figure 6A:
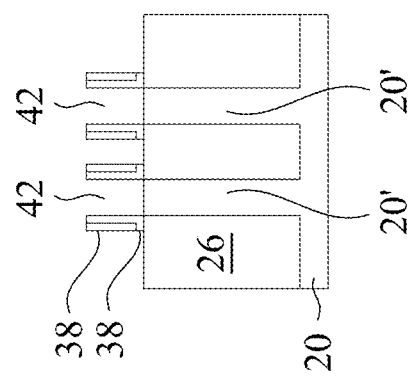

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 shown in FIG. 29. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch multilayer semiconductor stacks 22' and the underlying substrate strips 20'. The bottoms of recesses 42 are at least level with, or may be lower than (as shown in FIG. 6B), the bottoms of multilayer semiconductor stacks 22'. The etching may be anisotropic, so that the sidewalls of multilayer semiconductor stacks 22' facing recesses 42 are vertical and straight, as shown in FIG. 6B.

Figure 7B:
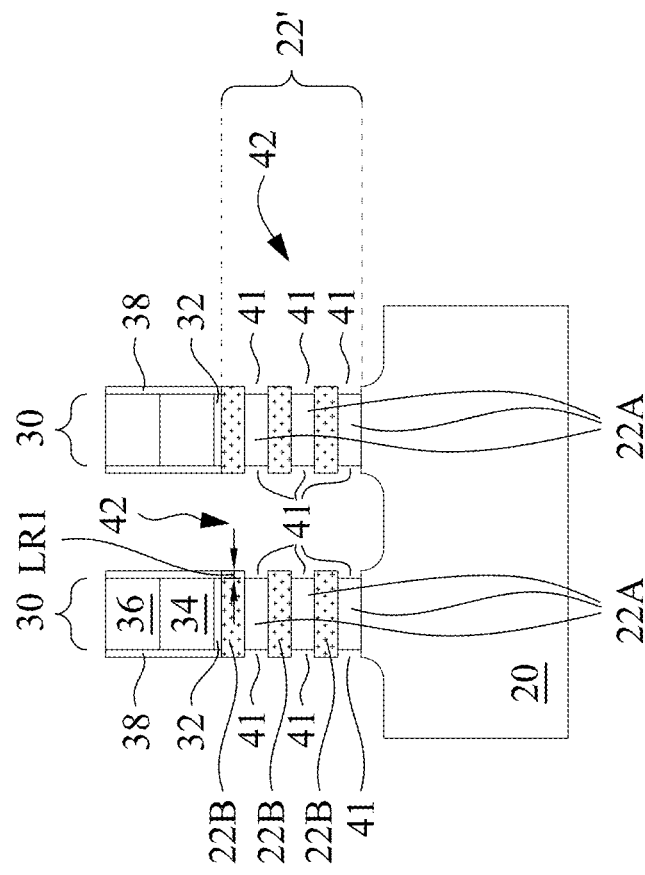
Figure 7A:
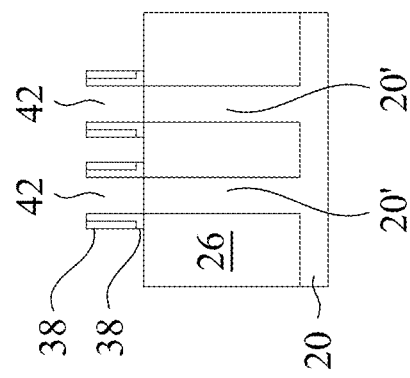

Referring to FIGS. 7A and 7B, sacrificial semiconductor layers 22A are laterally recessed to form lateral recesses 41, which are recessed from the edges of the respective overlying and underlying nanostructures 22B. The respective process is illustrated as process 212 in the process flow 200 shown in FIG. 29. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). The wet etching process may be performed using a dip process, a spray process, a spin-on process, or the like, and may be performed using any suitable process temperatures (for example, between about 400° C. and about 600° C.) and a suitable process time (for example, between about 100 seconds and about 1,000 seconds). In accordance with alternative embodiments, the lateral recessing of sacrificial semiconductor layers 22A is performed through an isotropic dry etching process or a combination of a dry etching process and a wet etching process. In accordance with some embodiments, the wet etching is prolonged, so that the lateral recessing distance LR1 is increased.

Figure 8B:
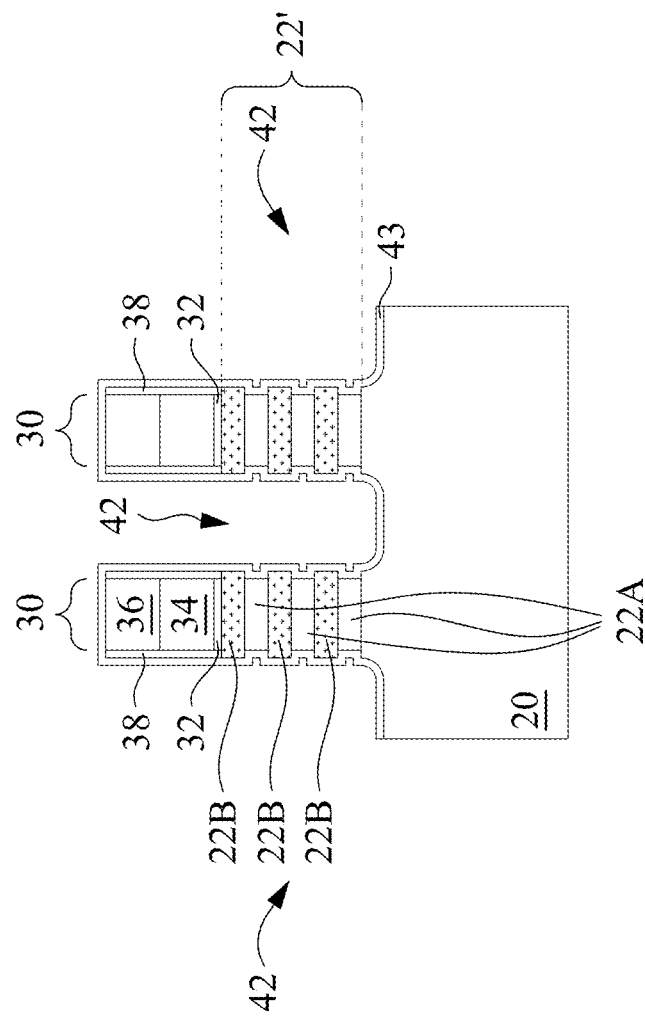
Figure 8A:
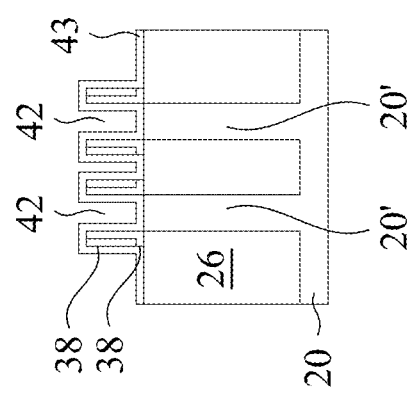

FIGS. 8A and 8B illustrate the deposition of spacer layer 43, which is formed of a dielectric material. The material of spacer layer 43 may include Si, O, C, N, or combinations thereof. The respective process is illustrated as process 214 in the process flow 200 shown in FIG. 29. Spacer layer 43 is deposited as a conformal layer, and has a relatively low k value, which may range from about 3.0 to about 4.5. Accordingly, spacer layer 43 may sometimes be formed as a low-k dielectric layer (when its k value is lower than about 3.8) or a high-k dielectric layer, depending on the formation process. The thickness of spacer layer 43 may be in the range between about 4 nm and about 6 nm. Spacer layer 43 may be a conformal layer, which extends into the lateral recesses 41 (FIG. 7B).

Figure 9B:
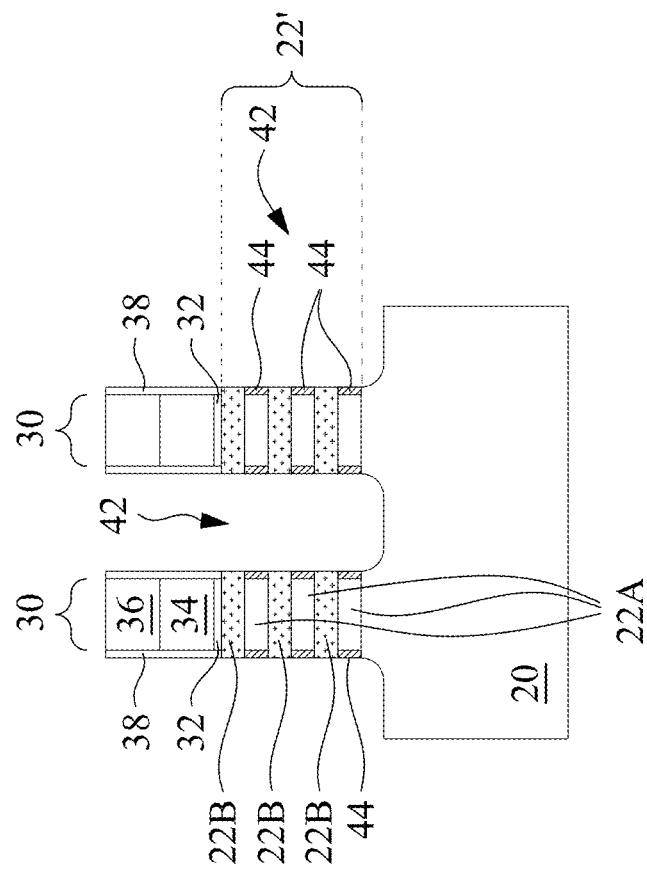
Figure 9A:
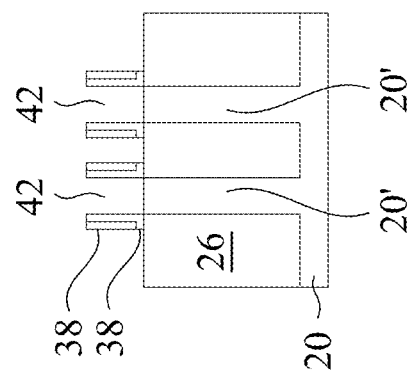
Figure 9C:
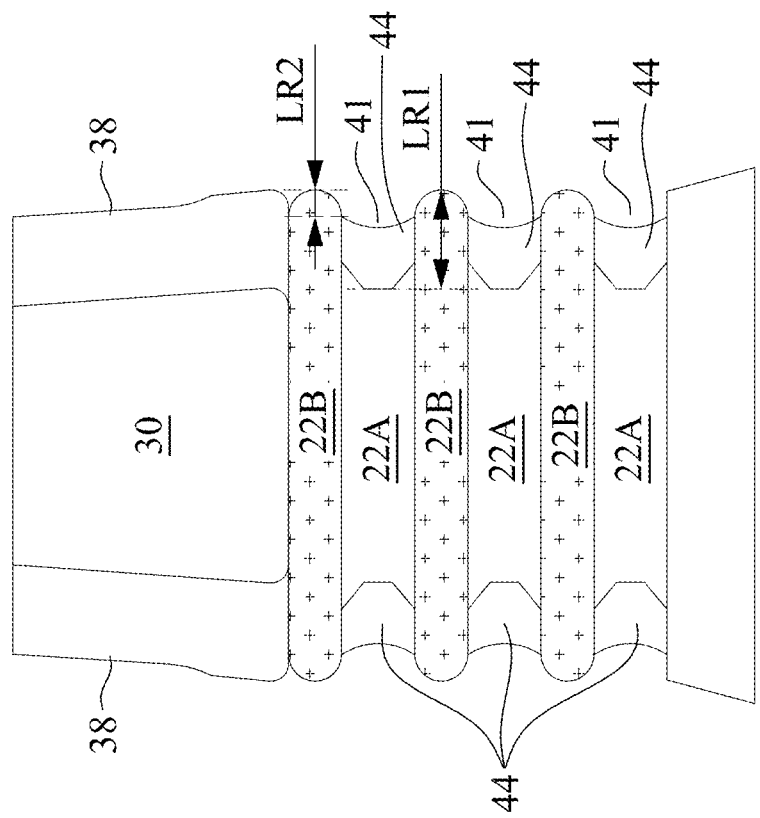

Referring to FIGS. 9A, 9B, and 9C, an etching process (also referred to as a spacer trimming process) is performed to trim the portions of spacer layer 43 outside of the lateral recesses 41, leaving the portions of spacer layer 43 in the lateral recesses 41. The respective process is illustrated as process 216 in the process flow 200 shown in FIG. 29. The remaining portions of spacer layer 43 are referred to as (dielectric) inner spacers 44. FIGS. 9A and 9B illustrate the cross-sectional views of the inner spacers 44 in accordance with some embodiments. The etching of spacer layer 43 may be performed through a wet etching process, in which the etching chemical may include $H_2SO_4$, diluted HF, ammonia solution ($NH_4OH$, ammonia in water), or the like, or combinations thereof.

The etching process may be performed until the edges of the inner spacers 44 are laterally recessed from the overlying and underlying nano structures 22B. For example, referring to FIG. 9C, the lateral recessing distance LR2 may be greater than about 5 nm, and may be in the range between about 5 nm and about 10 nm. The increase in the lateral recessing distances LR1 and LR2 (FIG. 9C) may help the formation of air inner spacers in subsequent processes.

In accordance with some embodiments, after the formation of inner spacers 44, the sidewall profile of nano structures 22B is further shaped in an isotropic etching process, an anisotropic etching process, or the combination of an isotropic etching process and an anisotropic etching process. The respective process is illustrated as process 218 in the process flow 200 shown in FIG. 29. The isotropic etching process may be performed through wet etching or dry etching. When a wet etching process is performed, potassium hydroxide (KOH), tetra methyl ammonium hydroxide (TMAH), ethylene di-amine pyro-catechol (EDP), or the like, or combinations thereof may be used. When an anisotropic dry etching process is performed, process gases such as $CF_4$, $CH_3F$, HBr, $O_2$, He, Ar, or the like may be used, with bias power being applied. When an isotropic dry etching process is performed, process gases such as $NF_3$, $Cl_2$, $H_2$, Ar, He, or the like, or combinations thereof may be used.

Figure 28D:
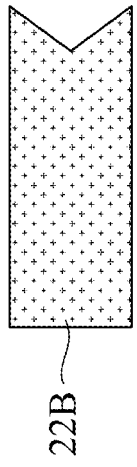
FIGS. 28A, 28B, 28C, 28D, and 28E illustrate some end profiles of semiconductor nano structures in accordance with some embodiments.
Figure 28E:
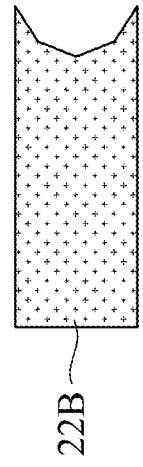
Figure 28A:
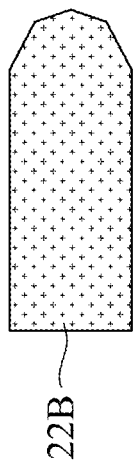
Figure 28B:
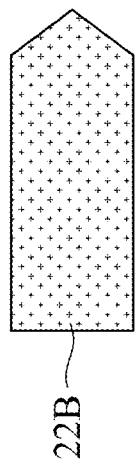
Figure 28C:
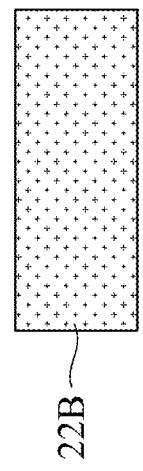

FIGS. 28A through 28E illustrate some end profiles of nano structures 22B in accordance with some embodiments after the shaping of the sidewall profile of nano structures 22B. In FIG. 28A, the end of nano structure 22B is rounded and convex. In FIG. 28B, the end of nano structure 22B has facets and may form a triangular shape. In FIG. 28C, the end of nano structure 22B is rectangular. In FIG. 28D, the end of nano structure 22B is concave and has a rectangular profile. In FIG. 28E, the end of nano structure 22B is concave, and may be rounded.

Although the inner sidewalls (contacting sacrificial layers 22A) and the outer sidewalls of the inner spacers 44 are schematically illustrated as being straight in FIG. 9B, the inner sidewalls and the outer sidewalls of the inner spacers 44 may be curved. As an example, FIG. 9C illustrates an amplified view of an embodiment in which the sidewalls of sacrificial layers 22A are concave, outer sidewalls of the inner spacers 44 are concave, and the inner spacers 44 are recessed from the corresponding sidewalls of nano structures 22B. The inner spacers 44 may be used to prevent the damage that may occur to subsequently formed source/drain regions (such as the epitaxial source/drain regions 48), which damage may be caused by subsequent etching processes (FIGS. 13A and 13B) for forming replacement gate structures.

Figure 10B:
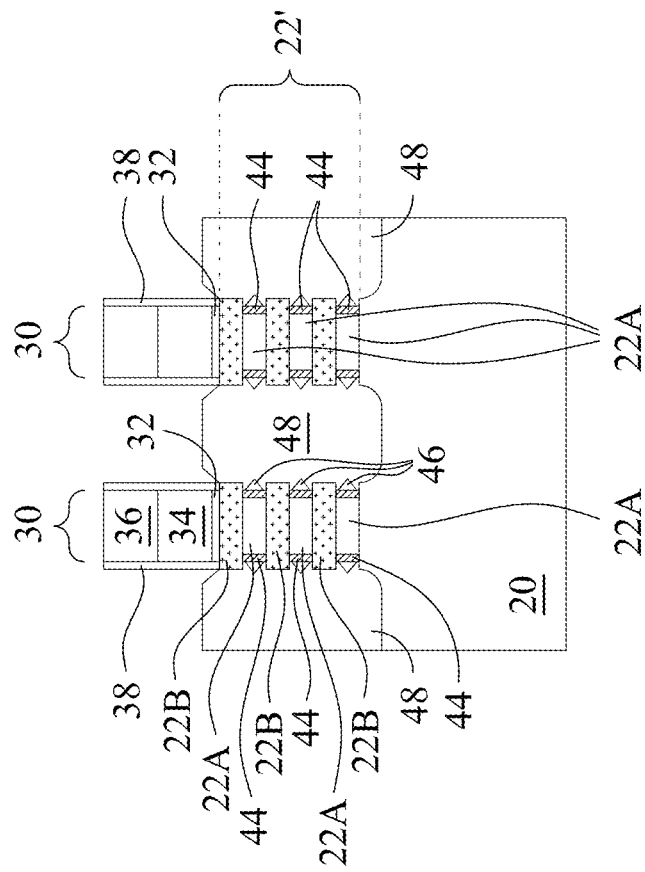
Figure 10A:
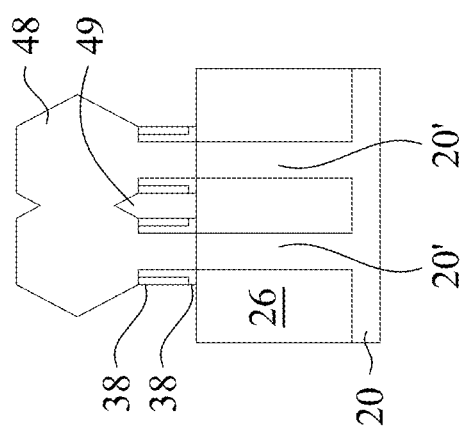

Referring to FIGS. 10A and 10B, epitaxial source/drain regions 48 are formed in recesses 42. The respective process is illustrated as process 220 in the process flow 200 shown in FIG. 29. In accordance with some embodiments, the source/drain regions 48 may exert stress on the nanostructures 22B, which are used as the channels of the corresponding GAA transistors, thereby improving performance. Depending on whether the resulting transistor is a p-type transistor or an n-type transistor, a p-type or an n-type impurity may be in-situ doped with the proceeding of the epitaxy. For example, when the resulting transistor is a p-type Transistor, silicon germanium boron (SiGeB), silicon boron (SiB), or the like may be grown. Conversely, when the resulting transistor is an n-type Transistor, silicon phosphorous (SiP), silicon carbon phosphorous (SiCP), SiAs, or the like, or combinations thereof may be grown. After recesses 42 are filled with epitaxy regions 48, the further epitaxial growth of epitaxy regions 48 causes epitaxy regions 48 to expand horizontally, and facets may be formed. The further growth of epitaxy regions 48 may also cause neighboring epitaxy regions 48 to merge with each other. Voids (air gaps) 49 (FIG. 10A) may be generated.

When the epitaxy regions 48 comprises silicon, the precursors may comprise a silicon-containing precursor such as a silane, such as monosilane ($SiH_4$), disilane ($Si_2H_6$), trisilane ($Si_3H_8$), trichlorosilane ($HCl_3Si$), dichlorosilane ($H_2SiCl_2$), or the like. When the dopant comprises arsenic, the dopant-containing precursor may include arsine ($AsH_3$) or the like. When the dopant comprises phosphorous, the dopant-containing precursor may be a phosphorous-containing precursor such as diphosphine ($P_2H_6$), phosphorus trichloride ($PCl_3$), or the like. The epitaxy temperature may be in the range between about 500° C. and about 800° C. The pressure of the precursors may be in range between about 1 Torr and about 760 Torr.

Figure 15:
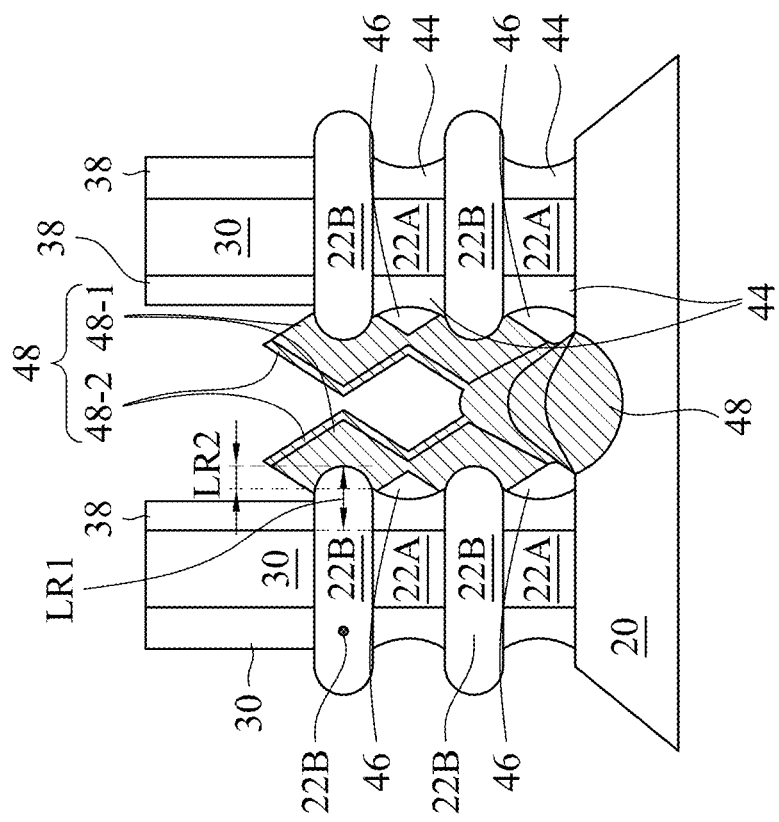
FIGS. 15 and 16 illustrate the intermediate stages in the growth of epitaxy source/drain regions and the formation of air inner spacers in accordance with some embodiments.
Figure 16:
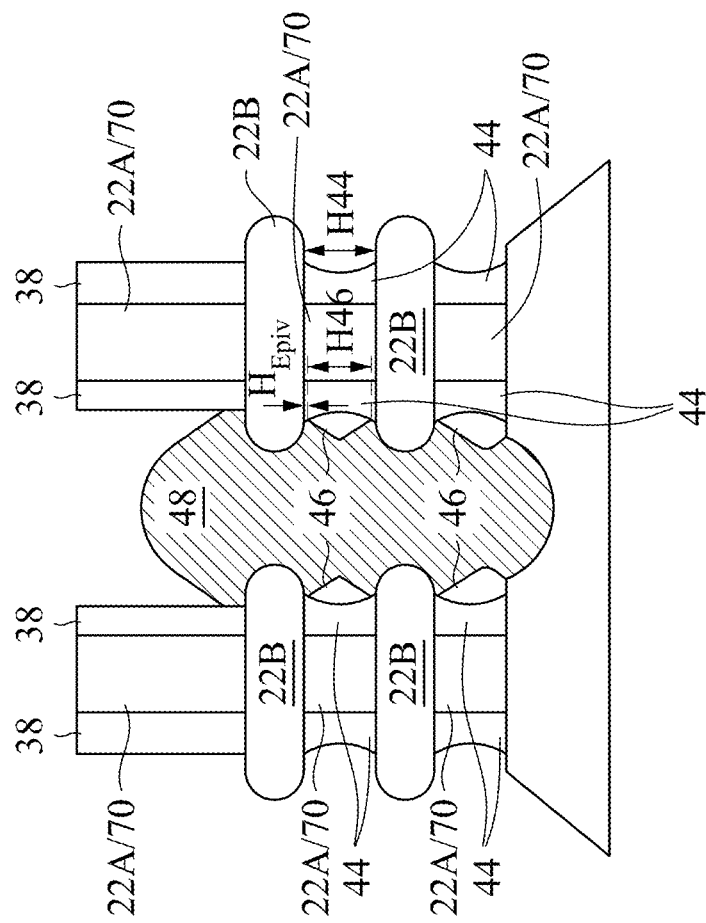

FIGS. 15 and 16 illustrate the intermediate stages in the formation of epitaxy regions 48 in accordance with some embodiments. Referring to FIG. 15, epitaxy regions 48 are selectively grown from semiconductor materials including bulk semiconductor substrate 20 and nano structures 22B. FIG. 15 schematically illustrates the layer-by-layer growth of epitaxy regions 48. For example, a first sub-layer 48-1 is grown first, and air inner spacers 46 (which may be filled with air later, or remain as vacuumed) are sealed in the first sub-layer 48-1. A second sub-layer 48-2 is then grown. FIG. 16 illustrates the further growth of epitaxy regions 48 to a level higher than the top nano structure 22B.

In the epitaxy, process conditions are adjusted to form air inner spacers 46. For example, reducing the wafer temperature in the formation of epitaxy regions 48, reducing the pressure of precursors, and/or increasing the flow rate of etching gases (such as $Cl_2$, HCl, or combinations thereof) may result in the increase in height $H_{EpiV}$ (FIG. 16), which is the height of the epitaxy regions 48 grown from and contacting inner spacers 44. The height H46 of air inner spacer 46 is equal to (H44−2*$H_{EpiV}$), with H44 being the height of inner spacer 44. When $H_{EpiV}$ is increased, the height H46 of air inner spacer 46 is reduced. Conversely, increasing the wafer temperature, increasing the pressure of precursors, and/or reducing the flow rate of etching gases (such as $Cl_2$, HCl, or combinations thereof) may reduce the $H_{EpiV}$ value, and accordingly may increase the height H46 of air inner spacers 46.

Figure 17C:
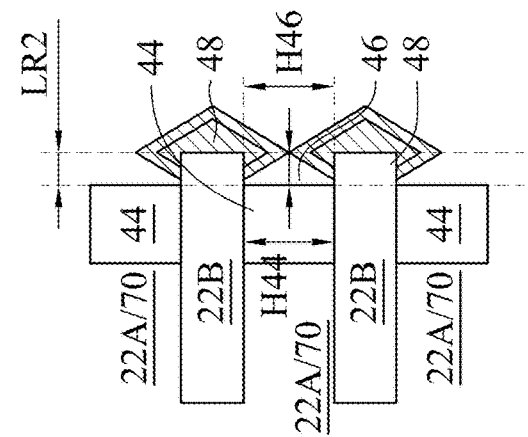
FIGS. 17A, 17B, and 17C illustrate the sizes of air inner spacers in accordance with some embodiments.
Figure 17B:
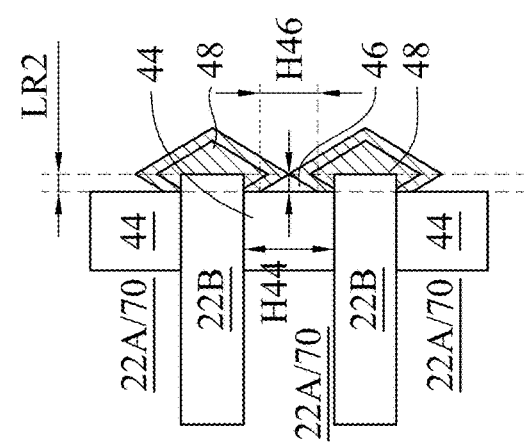
Figure 17A:
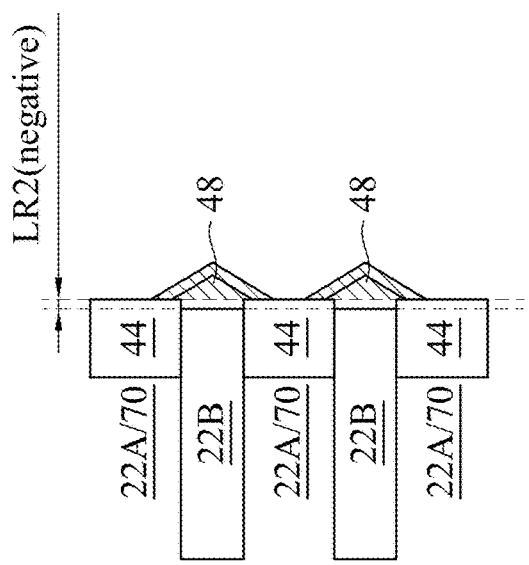

Furthermore, the lateral recessing distance LR2 also affects whether the air inner spacers 46 can be generated or not, and the sizes of the air inner spacers 46. For example, FIGS. 17A, 17B, and 17C illustrate that with the increase in LR2 from negative value to positive value, the air inner spacers 46 start to appear, and with the increase in lateral recessing distance LR2, the sizes of the air inner spacers 46 increase accordingly. In FIGS. 17A, 17B, and 17C and some subsequent figures, the reference "22A/70" represents that the corresponding regions may be sacrificial layers, and are also the replacement gate regions after sacrificial layers are removed. In the embodiments as shown in FIG. 17A, the lateral recessing distance LR2, which is the recessing of the outer sidewall of inner spacer 44 from the outer sidewall of nano structure 22B, has a negative value, and no air inner spacer is formed. In FIG. 17B, lateral recessing distance LR2 has a small positive value. A small air inner spacer 46 is formed, and its height H46 is smaller than the height H44 of inner spacer 44. In FIG. 17C, lateral recessing distance LR2 has a higher positive value. The height H46 of air inner spacer 46 is equal to the height H44 of inner spacer 44.

In accordance with some embodiments, the embodiments in FIG. 17B or 17C may be adopted, depending on the requirement of the resulting GAA transistor. In addition, by adjusting the recessing distances LR2, a first transistor, a second transistor, and a third transistor having the structures as shown in FIGS. 17A, 17B, and 17C, respectively, may be formed in the same die/wafer through different processes, so that the performance of the resulting transistors may be tuned to desirable.

After the epitaxy process, epitaxy regions 48 may be further implanted with a p-type or an n-type impurity to form source and drain regions, which are also denoted using reference numeral 48. In accordance with alternative embodiments of the present disclosure, the implantation process is skipped when epitaxy regions 48 are in-situ doped with the p-type or n-type impurity during the epitaxy, and the epitaxy regions 48 are also source/drain regions.

Figure 11B:
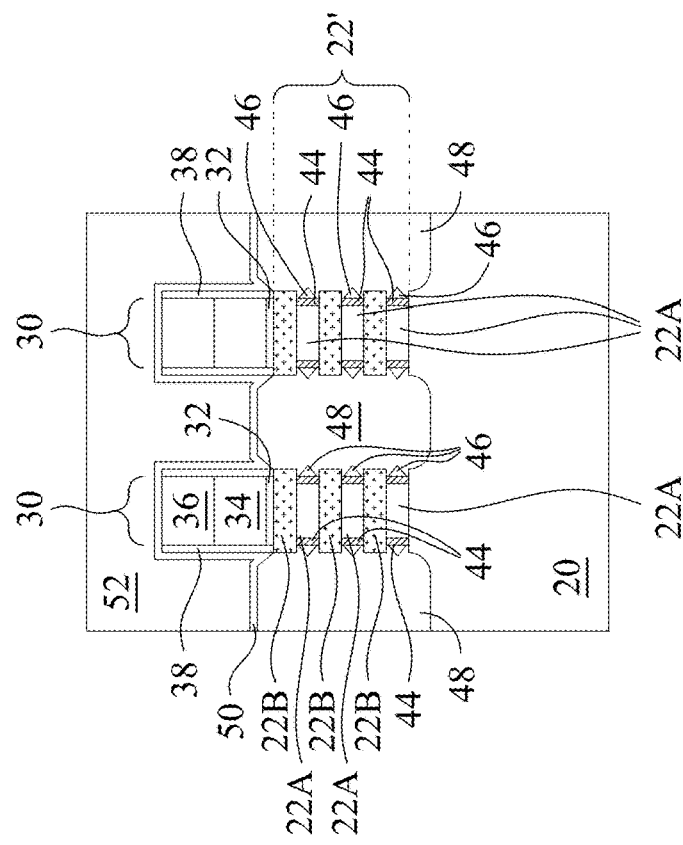
Figure 11A:
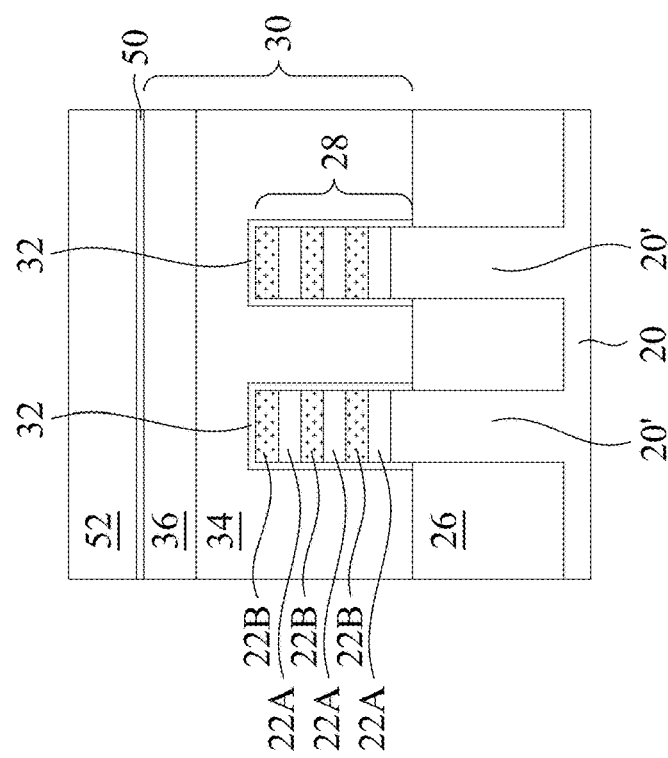
Figure 11C:
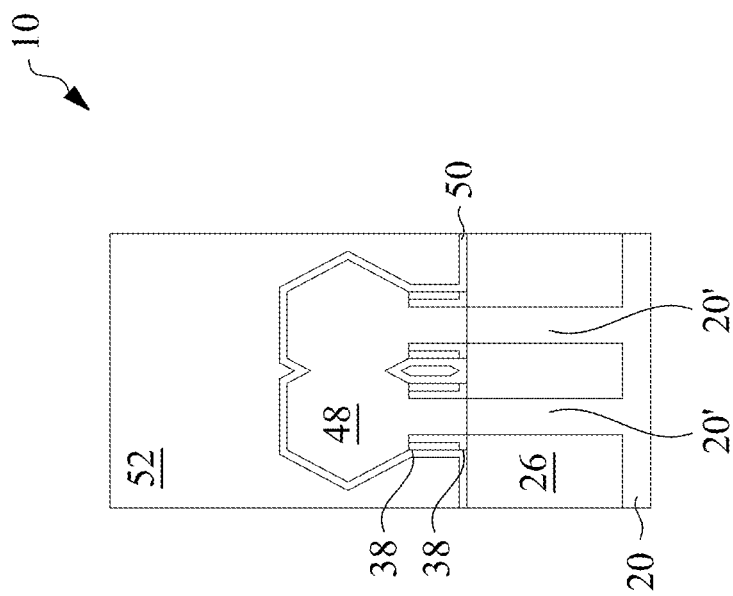

FIGS. 11A, 11B, and 11C illustrate the cross-sectional views of the structure after the formation of Contact Etch Stop Layer (CESL) 50 and Inter-Layer Dielectric (ILD) 52. The respective process is illustrated as process 222 in the process flow 200 shown in FIG. 29. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), Undoped Silicate Glass (USG), or the like.

Figure 12B:
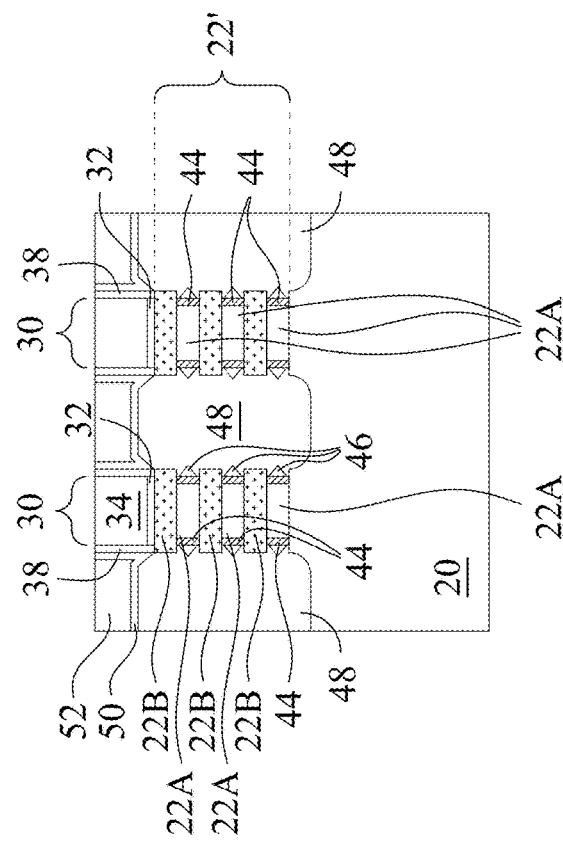
Figure 12A:
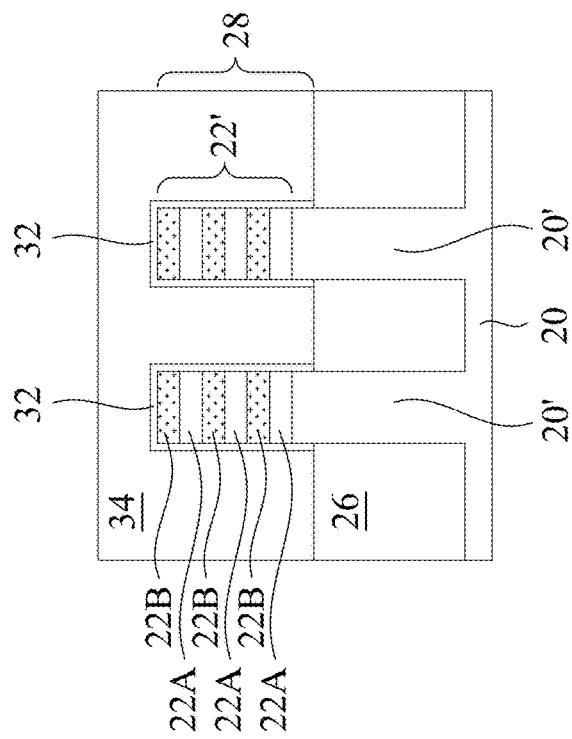

FIGS. 12A and 12B through FIGS. 14A and 14B illustrate the process for forming replacement gate stacks. In FIGS. 12A and 12B, a planarization process such as a CMP process or a mechanical grinding process is performed to level the top surface of ILD 52. The respective process is illustrated as process 224 in the process flow 200 shown in FIG. 29. In accordance with some embodiments, the planarization process may remove hard masks 36 to reveal dummy gate electrodes 34, as shown in Figures 12A and 12B. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level within process variations.

Figure 13B:
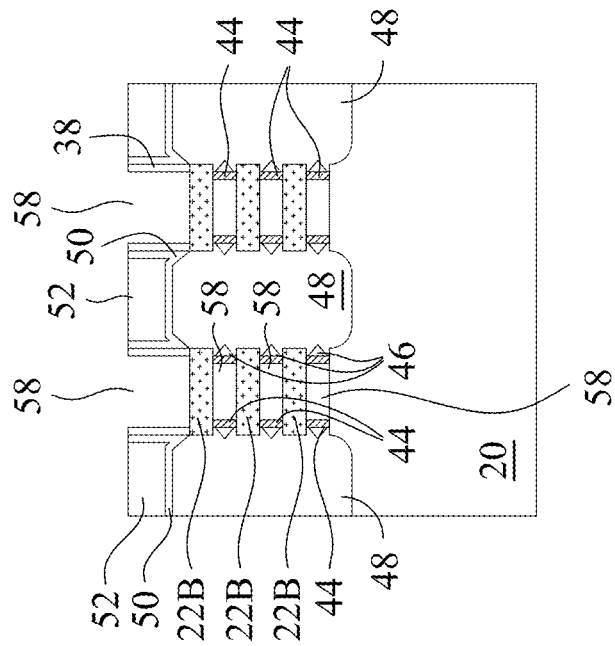
Figure 13A:
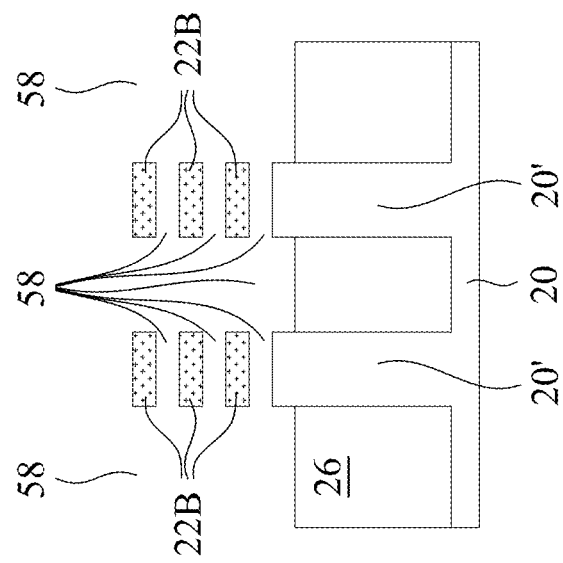

Next, dummy gate stacks 30 are replaced with replacement gate stacks. In the replacing process, dummy gate electrodes 34 (and hard masks 36, if remaining) and dummy gate dielectrics 32 are removed in one or more etching processes, so that recesses 58 are formed, as shown in FIGS. 13A and 13B. The respective process is illustrated as process 226 in the process flow 200 shown in FIG. 29. In accordance with some embodiments, dummy gate electrodes 34 and dummy gate dielectrics 32 are removed through an anisotropic or isotropic dry etch process. For example, the etching process may be performed using reaction gas(es) that selectively etch dummy gate electrodes 34 at a faster rate than ILD 52.

Next, sacrificial layers 22A are removed to extend the recesses 58 between nanostructures 22B, and the resulting structure is also shown in FIGS. 13A and 13B. Sacrificial layers 22A may be removed by performing an isotropic etching process such as a wet etching process using etchants which are selective to the materials of sacrificial layers 22A, while nanostructures 22B, substrate 20, and STI regions 26 remain un-etched as compared to sacrificial layers 22A. In accordance with some embodiments in which sacrificial layers 22A include, for example, SiGe, and nanostructures 22B include, for example, Si or SiC, TMAH, ammonium hydroxide (NH$_4$OH), or the like may be used to remove sacrificial layers 22A.

Figure 14B:
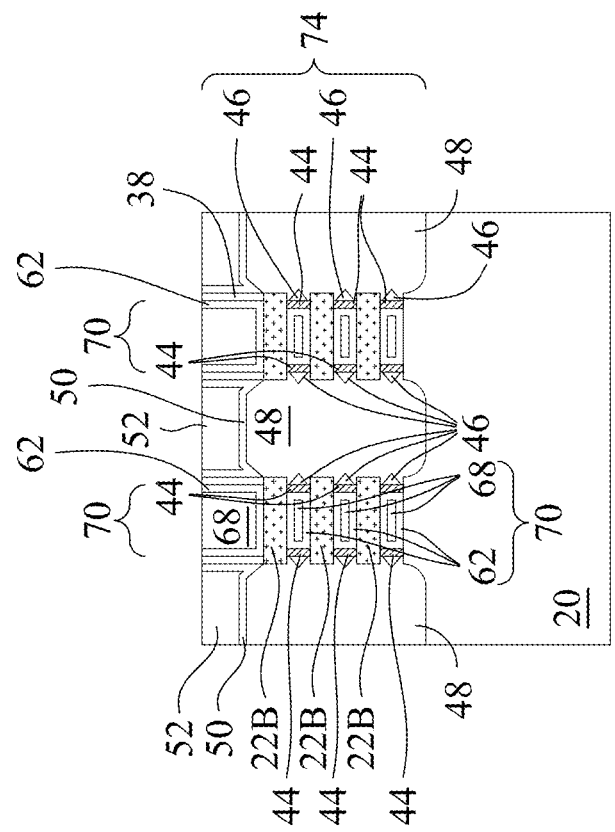
Figure 14A:
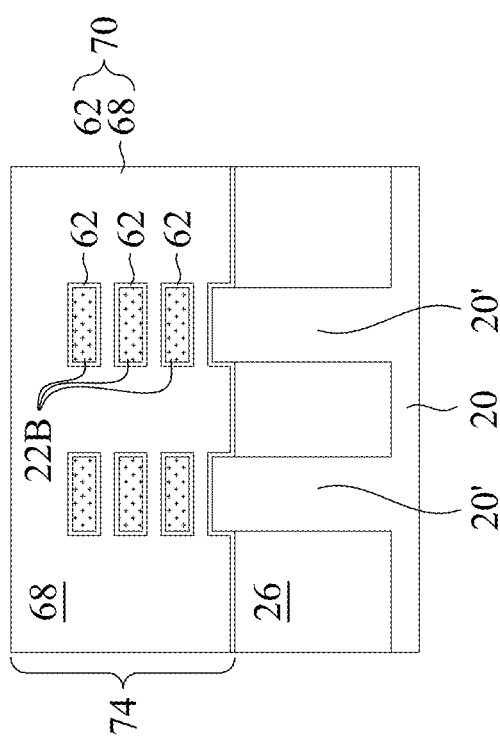

In subsequent processes, replacement gate stacks are formed. The respective process is illustrated as process 228 in the process flow 200 shown in FIG. 29. Referring to FIGS. 14A and 14B, gate dielectrics 62 are formed. In accordance with some embodiments, each of gate dielectric 62 includes an interfacial layer and a high-k dielectric layer on the interfacial layer. The interfacial layer may be formed of or comprises silicon oxide, which may be deposited through a conformal deposition process such as ALD or CVD. In accordance with some embodiments, the high-k dielectric layers comprise one or more dielectric layers. For example, the high-k dielectric layer(s) may include a metal oxide or a silicate of hafnium, aluminum, zirconium, lanthanum, manganese, barium, titanium, lead, and combinations thereof.

Gate electrodes 68 are then formed. In the formation, conductive layers are first formed on the high-k dielectric layer, and fill the remaining portions of recesses 58. Gate electrodes 68 may include a metal-containing material such as TiN, TaN, TiAl, TiAlC, cobalt, ruthenium, aluminum, tungsten, combinations thereof, and/or multilayers thereof. For example, although single-layer gate electrodes 68 are illustrated in FIGS. 14A and 14B, gate electrodes 68 may comprise any number of layers, any number of work function layers, and possibly a filling material. Gate dielectrics 62 and gate electrodes 68 also fill the spaces between adjacent ones of nanostructures 22B, and fill the spaces between the bottom ones of nanostructures 22B and the underlying substrate strips 20'. After the filling of recesses 58, a planarization process such as a CMP process or a mechanical grinding process is performed to remove the excess portions of the gate dielectrics and the material of gate electrodes 68, which excess portions are over the top surface of ILD 52. Gate electrodes 68 and gate dielectrics 62 are collectively referred to as gate stacks 70 of the resulting nano-FETs. GAA transistor 74 is thus formed.

Figure 19:
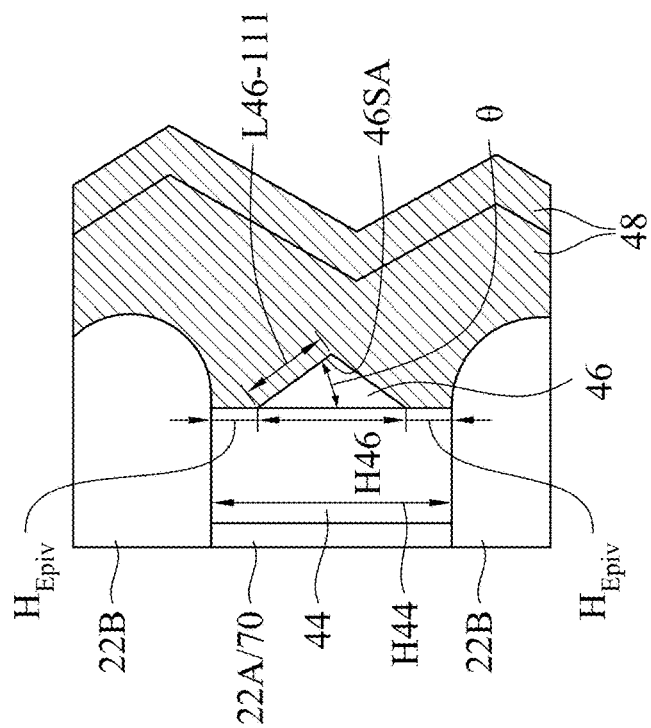
FIGS. 18 and 19 illustrate the profiles of nano semiconductor structures and dielectric inner spacers in accordance with some embodiments.
Figure 18:
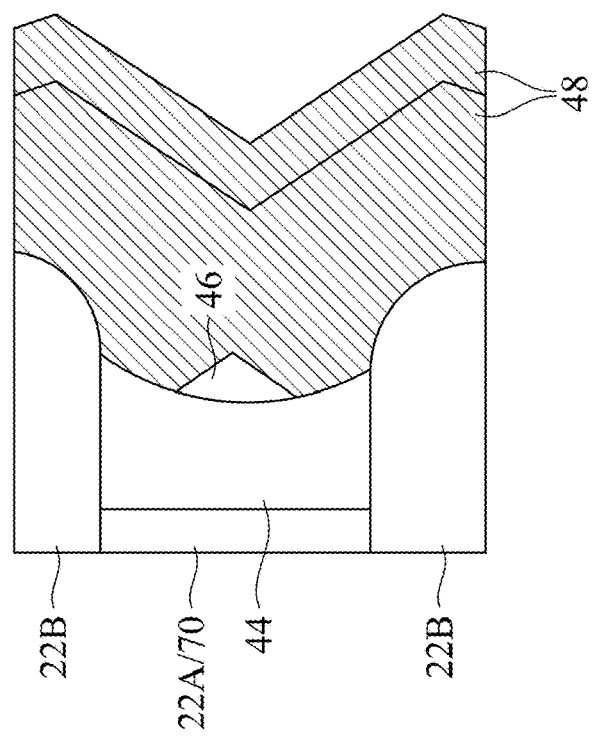

FIGS. 18 and 19 illustrate air inner spacers 46 in accordance with some embodiments. In FIG. 18, the outer sidewall of inner spacer 44 exposed to the air inner spacer 46 is curved and concave. In FIG. 19, the outer sidewall of inner spacer 44 exposed to the air inner spacer 46 is straight.

Figure 20C:
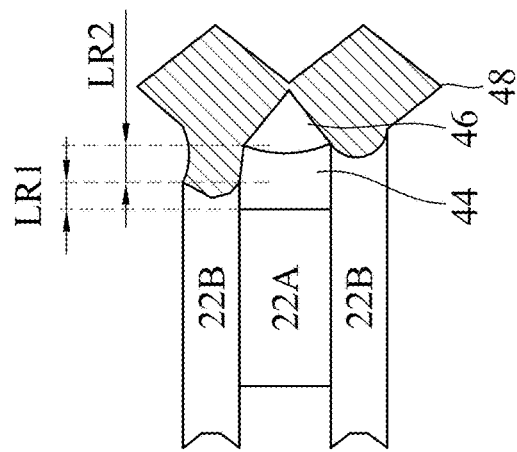
FIGS. 20A, 20B, and 20C illustrate the relative positions of nano semiconductor structures and air inner spacers in accordance with some embodiments.
Figure 20B:
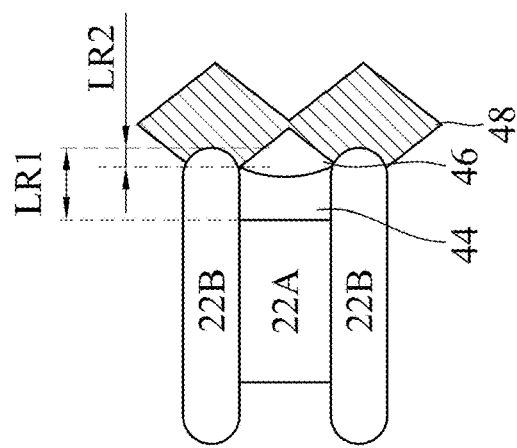
Figure 20A:
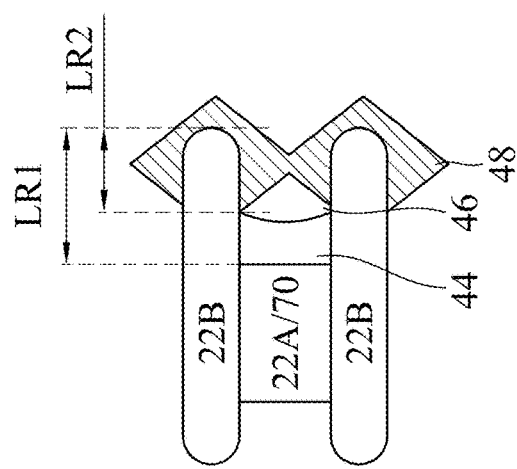

FIGS. 20A, 20B, and 20C illustrate some different relative positions of inner spacers 44 relative to the ends of nano structures 22B. From FIG. 20A to FIG. 20B, the lateral recessing values LR1 and LR2 reduce. In FIG. 20C, the lateral recess LR2 of inner spacer 44 relative to the end of nano structures 22B becomes negative, meaning nano structures 22B are recessed laterally from the respective outer edges of inner spacer 44.

Figure 21:
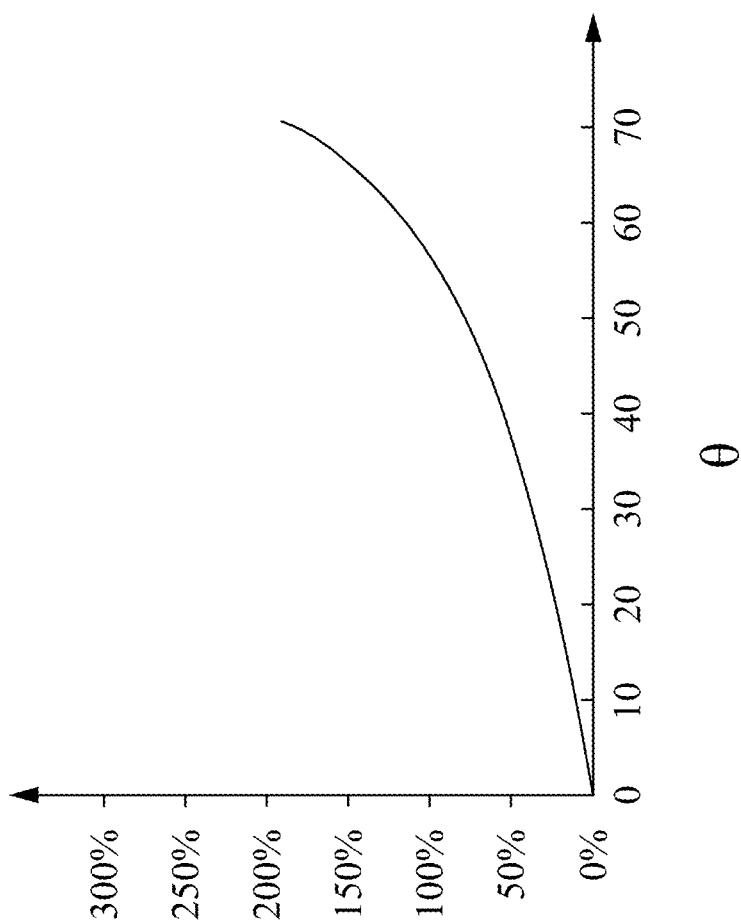
FIG. 21 illustrates the sizes of air inner spacers as a function of angles of the air inner spacers in accordance with some embodiments.

FIG. 21 illustrates the ratio H46/L$_{46\text{-}111}$, which is the ratio of Height H46 of air inner spacer 46 to the length L$_{46\text{-}111}$ (marked in FIG. 19) of a side 46SA (FIG. 19) of air inner spacer 46 when the side 46SA is in a {111} plane of the epitaxy region 48. The ratio H46/L$_{46\text{-}111}$ is shown in FIG. 21 as a function of angle θ, which is also marked in FIG. 19. In accordance with some embodiments, the height H46 of air inner spacer 46 may be expressed as $$H46 \sim (H44 - 2H_{Epiv})/2 \ast \tan \theta$$

When angle θ is about 45 degrees, the height H46 of air inner spacer 46 may be expressed as $((H44-2H_{EpiV})\ast\text{sqrt}(2))/2$. Assuming the height H46 when sidewall 46SA is on the {111} plane is L$_{46\text{-}111}$, when sidewall 46SA deviates from the {111} plane (θ reduces), the height H46 reduces accordingly, and ratio H46/L$_{46\text{-}111}$ may be shown as in FIG.

21. The volume of air inner spacers 46 may increase with the increase in angle θ. In accordance with some embodiments, the angle θ is smaller than about 40 degrees, and may be in the range between about 10 degrees and about 40 degrees.

In FIGS. 18 and 19, epitaxy regions 48 may be in contact with the respective inner spacers 44 to form interfaces, or may extend to inner spacers 44, but have no interfaces formed. Clearly, with the increase in the vertical interface, the size of air inner spacer 46 is also reduced. The vertical interface may also be equal to zero, and hence epitaxy regions 48 may extend to overlying and underlying nano structures 22B.

Figure 23:
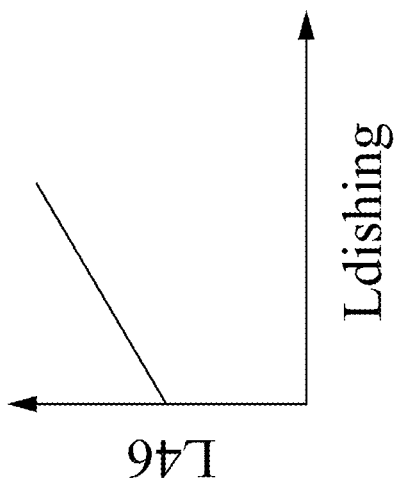
FIG. 23 illustrates the sizes of air inner spacers as a function of the dishing of dielectric inner spacers in accordance with some embodiments.
Figure 22:
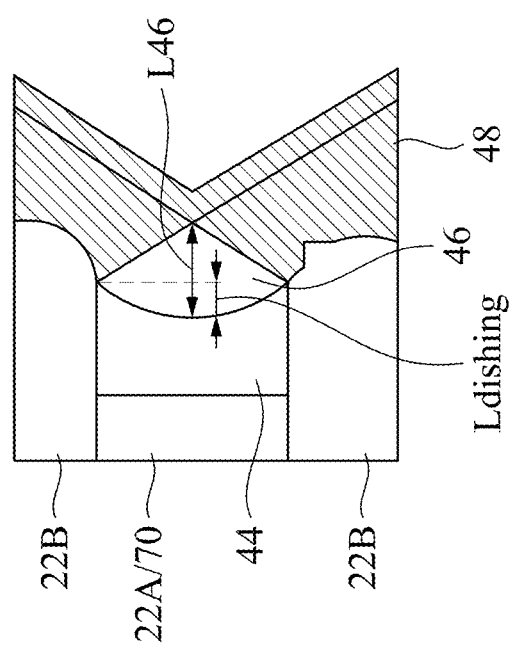
FIG. 22 illustrates the dishing of dielectric inner spacers in accordance with some embodiments.

FIGS. 22 and 23 illustrate the effect of dishing (concave recessing) of inner spacer 44. FIG. 22 illustrates that the dishing $L_{dishing}$ is measured from the outmost point of the outer sidewall of inner spacer 44 to the inner most point of the outer sidewall of inner spacer 44. FIG. 23 illustrates that the lateral length L46 of air inner spacer 46 is linear to dishing $L_{dishing}$.

Figure 24A:
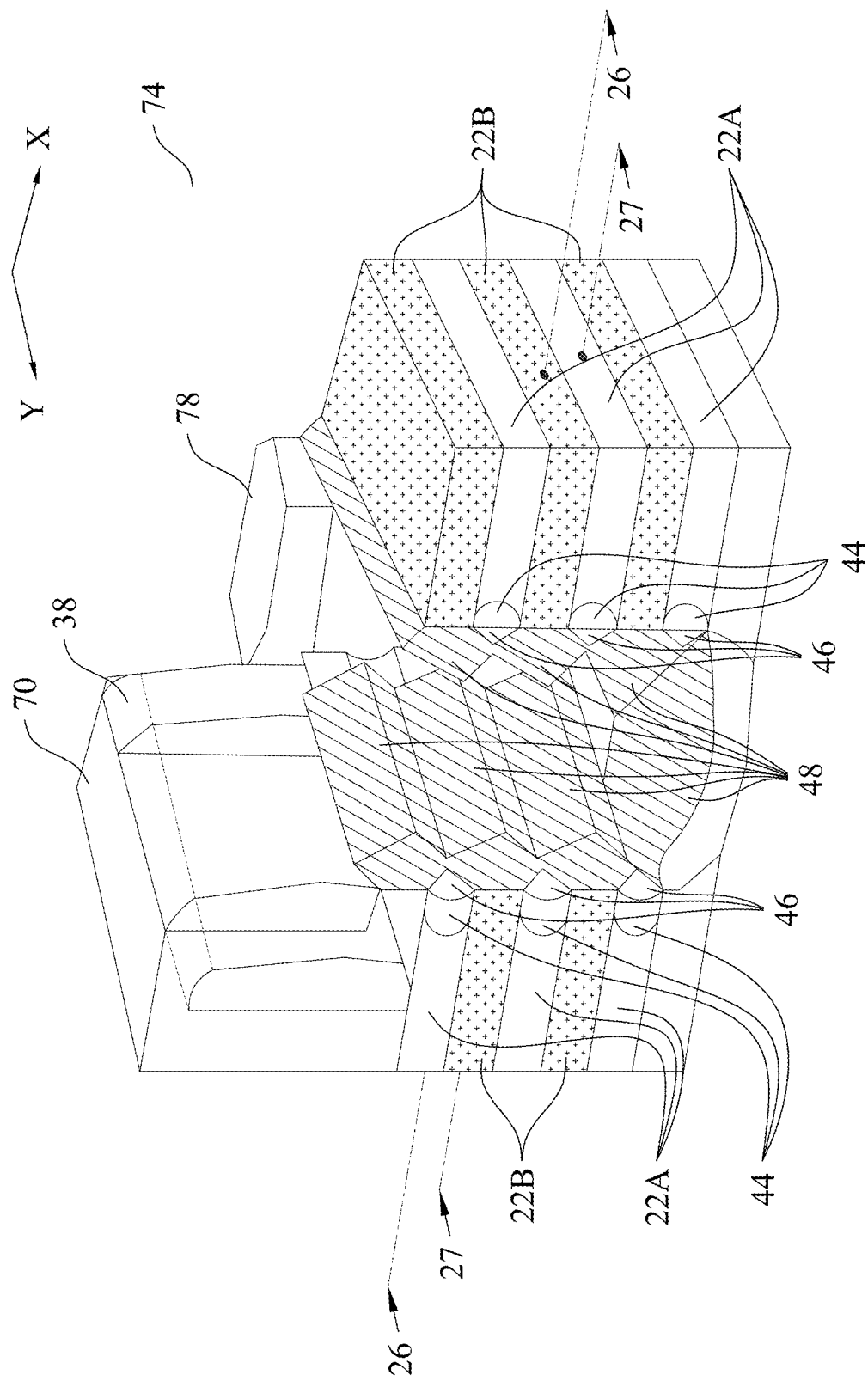
FIG. 24A illustrates a perspective view of a FinFET and air inner spacers in accordance with some embodiments

FIG. 24A illustrates a perspective view of some portions of GAA transistor 74 in accordance with some embodiments. FIG. 24B illustrates a perspective view of one of air inner spacers 46, which forms a tunnel. Air inner spacer 46 has two end points 76A and 76B, and middle point 76C, wherein air inner spacer 46 have widths L46-A, L46-B, and L46-C at end point 76A, middle point 76C, and end point 76B, respectively. End points 76A and 76B are also the entrance points of the tunnel of air inner spacer 46. Epitaxy region 48 accordingly may have higher growth rates at end points 76A and 76B than at the middle point 76C since after air inner spacer 46 is sealed by epitaxy region 48, the precursors need to flow through the end points 76A and 76B in order to reach the middle point 76C. The end widths L46-A and L46-C are smaller than middle width L46-B.

Figure 24C:
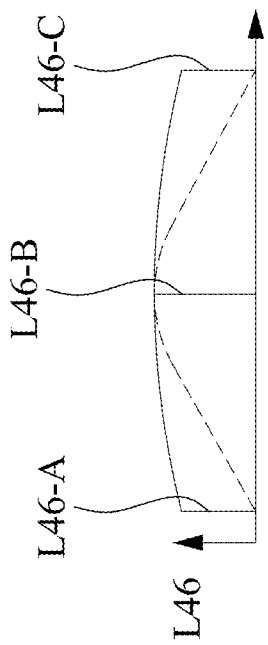
FIGS. 24B and 24C illustrate a perspective view and a cross-sectional view of an air inner spacer in accordance with some embodiments.
Figure 24B:
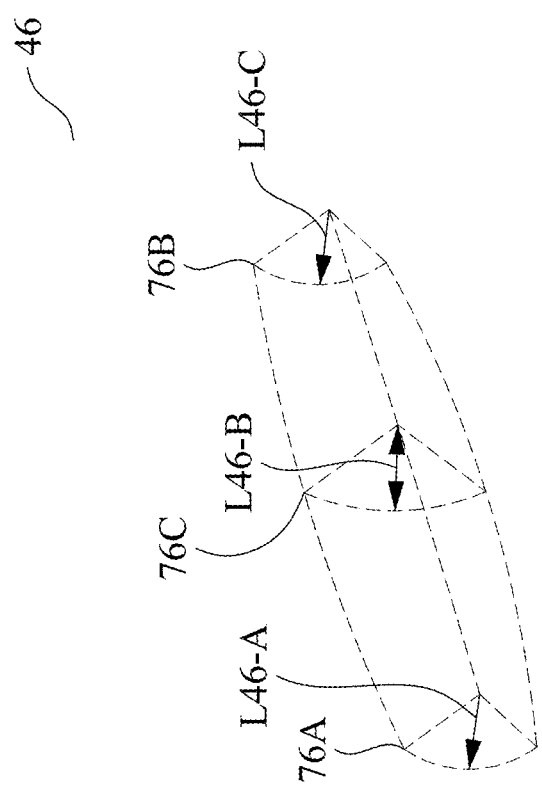

FIG. 24C schematically illustrates how the widths of air inner spacer 46 change from end point 76A to end point 76B. It shows that the middle width L46-B may be the greatest, and from middle point 76C to end points 76A and 76B, the widths of air inner spacer 46 reduce gradually. In accordance with some embodiments, ratios L46-A/L46-B and L46-C/L46-B may be in the range between about 0 percent and about 200 percent. When ratios L46-A/L46-B and L46-C/L46-B are equal to zero percent, the corresponding widths L46-A and L46-C are equal to zero, as represented by the dashed line in FIG. 24C, which shows that corresponding widths of air inner spacer 46. When widths L46-A and L46-C are equal to zero, the corresponding inner spacer is fully sealed by the corresponding inner spacer 44, epitaxy region 48, and possibly the overlying and/or underlying nano structure(s) 22B.

Figure 25C:
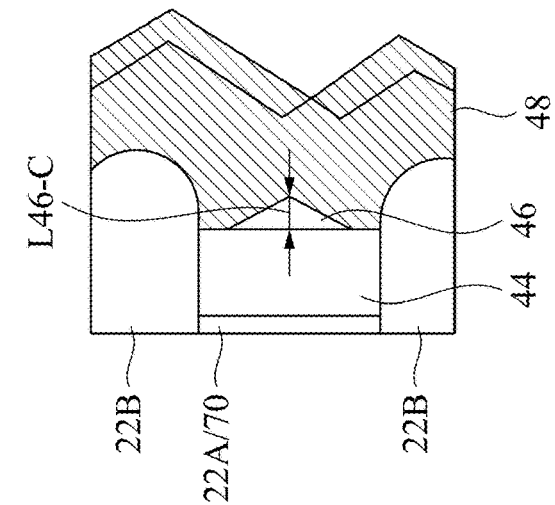
FIGS. 25A, 25B, and 25C illustrate the shapes and sizes of air inner spacers in accordance with some embodiments.
Figure 25B:
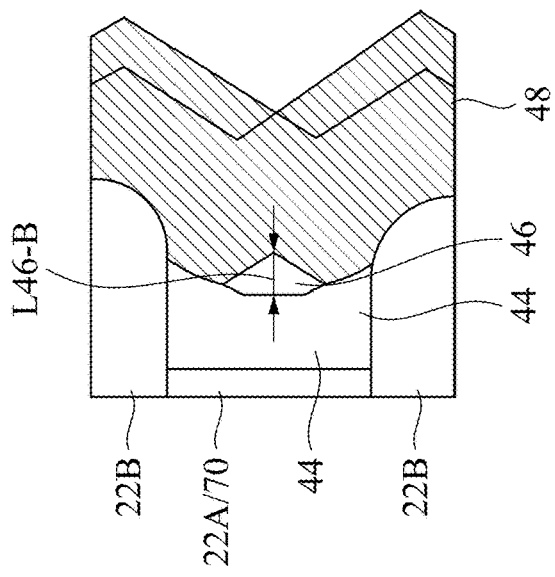
Figure 25A:
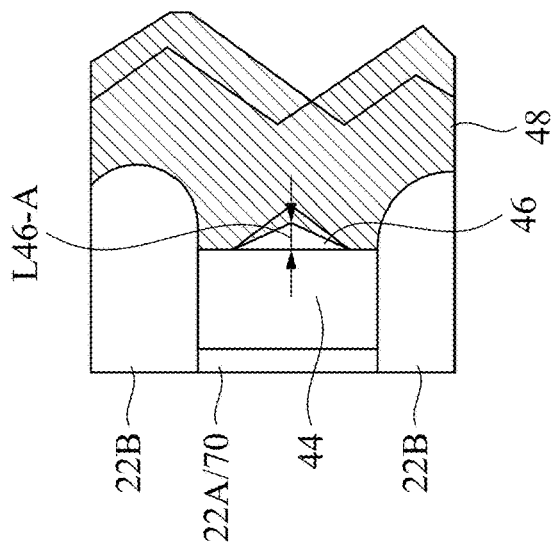

FIGS. 25A, 25B, and 25C schematically illustrate the cross-sectional views of air inner spacer 46 and inner spacer 44 at end point 76A, end point 76B, and end point 76B, respectively. It is appreciated that at the time the epitaxy region 48 grown from neighboring nano structures 22B touch each other, middle width L46-B may be fixed. With the proceeding of the formation of epitaxy regions 48, widths L46-A and L46-C, on the other hand, will become increasingly smaller, and may or may not be reduced to zero when the epitaxy process is ended.

Figure 26:
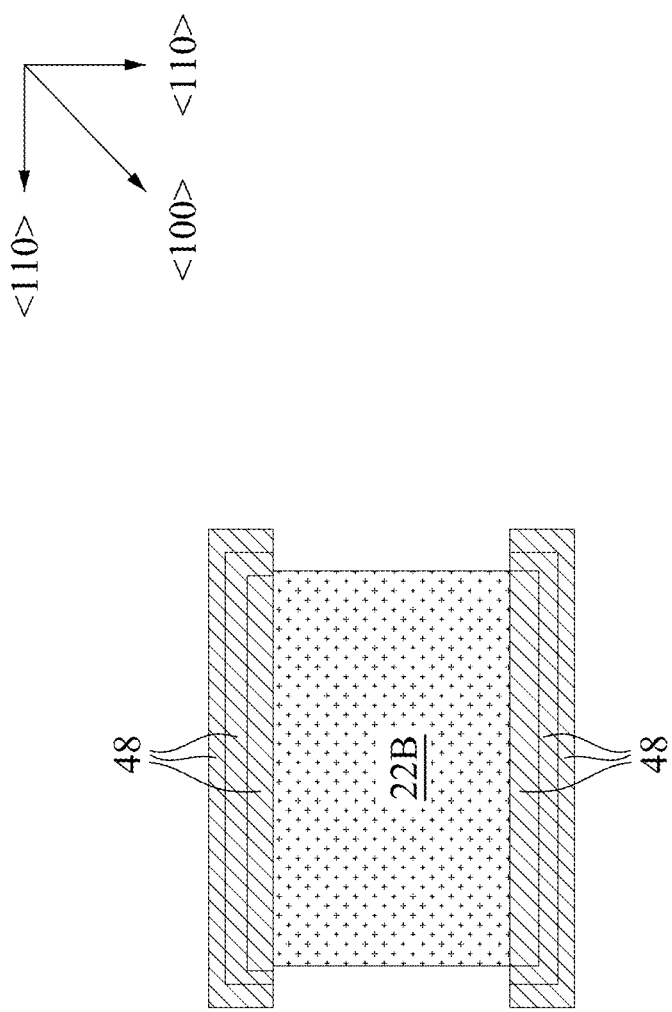
FIGS. 26 and 27 illustrate the top views of a GAA transistor in accordance with some embodiments.

FIG. 26 illustrates a top view in a horizontal plane crossing nano structure 22B in accordance with some embodiments. The horizontal plane contains line 26-26 in FIG. 24A. FIG. 26 illustrates that epitaxy region 48 directly grows from nano structure 22B, and air inner spacer 46 does not extend into this plane. The example lattice directions <110>, <100>, and <110> of substrate 20 and epitaxy region 48 are shown in FIG. 26 also.

Figure 27:
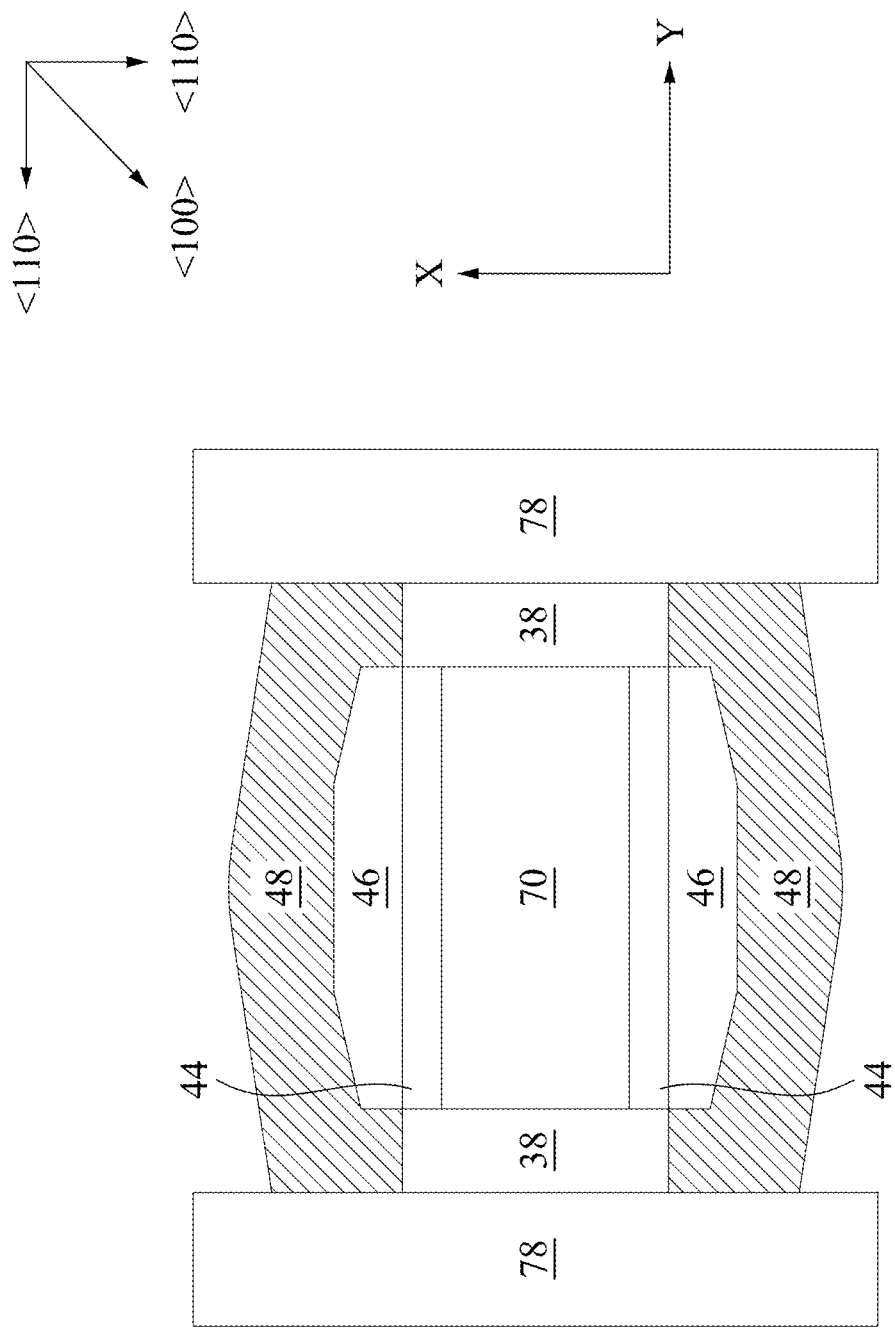

FIG. 27 illustrates a top view in a horizontal plane crossing gate stack 70, inner spacer 44, and air inner spacer 46 in accordance with some embodiments. The horizontal plane contains line 27-27 in FIG. 24A. The X-direction and Y-direction as shown in FIG. 27 correspond to the X-directions and Y-directions in FIGS. 4 and 24A. The example lattice directions <110>, <100>, and <110> are shown in FIG. 27 also. When there are dielectric fins 78 aside of nano structure 22B, epitaxy region 48 grows to, and are blocked by, dielectric fins 78, which may be high-k dielectric fins. It is appreciated that dielectric fins 78 are optional, and may be or may not be formed.

The embodiments of the present disclosure have some advantageous features. By forming air inner spacers, the growth of epitaxy source/drain regions directly from dielectric inner spacers is reduced, and the resulting defects are also reduced. The performance of the GAA transistors is improved. The volume of the epitaxy source/drain regions is also reduced, and the parasitic capacitance of the GAA transistor is accordingly reduced.

In accordance with some embodiments of the present disclosure, a method comprises forming a stack of layers comprising a plurality of semiconductor nano structures; and a plurality of sacrificial layers, wherein the plurality of semiconductor nano structures and the plurality of sacrificial layers are arranged alternatingly; laterally recessing the plurality of sacrificial layers to form lateral recesses; forming inner spacers in the lateral recesses; and epitaxially growing a source/drain region from the plurality of semiconductor nano structures, wherein the source/drain region is spaced apart from the inner spacers by air inner spacers. In an embodiment, the inner spacers have concaved outer sidewalls facing the air inner spacers. In an embodiment, the method further comprises, after the inner spacers are formed, laterally recessing the plurality of semiconductor nano structures. In an embodiment, the air inner spacers extend into the lateral recesses. In an embodiment, the method further comprises, after the source/drain region is grown, removing the plurality of sacrificial layers; and forming a gate stack extending into spaces left by the plurality of sacrificial layers that have been removed. In an embodiment, one of the air inner spacers extend into one of the inner spacers. In an embodiment, the forming the inner spacers comprises depositing a dielectric layer extending into the lateral recesses; and etching the dielectric layer, wherein remaining portions of the dielectric layer form the inner spacers. In an embodiment, one of the air inner spacers has two end portions, and a middle portion wider than the two end portions. In an embodiment, the end portions have a width substantially equal to zero.

In accordance with some embodiments of the present disclosure, an integrated circuit structure comprises a plurality of semiconductor nano structures, wherein upper ones of the plurality of semiconductor nano structures overlap corresponding lower ones of the plurality of semiconductor nano structures; a gate stack comprising portions separating the plurality of semiconductor nano structures from each other; inner spacers separating the plurality of semiconductor nano structures from each other; and a source/drain region on a side of the plurality of semiconductor nano structures, wherein the source/drain region is spaced apart from the inner spacers by air inner spacers.

In an embodiment, one of the air inner spacers extends to a space between an overlying one and an underlying one of the plurality of semiconductor nano structures. In an embodiment, one of the air inner spacers is separated from an overlying one or an underlying one of the plurality of semiconductor nano structures by a part of one of the inner spacers and a part of the source/drain region. In an embodiment, in a cross-sectional view of the integrated circuit structure, one of the air inner spacers comprises two straight edges joined with each other. In an embodiment, one of the air inner spacers comprises a first end portion and a second end portion; and a middle portion between, and being wider than, the first end portion and the second end portion. In an embodiment, one of the inner spacers comprises a concave sidewall exposed to one of the air inner spacers. In an embodiment, upper ones of the air inner spacers overlap lower ones of the air inner spacers.

In accordance with some embodiments of the present disclosure, an integrated circuit structure comprises a first semiconductor layer; a second semiconductor layer over and vertically spaced apart from the first semiconductor layer; a dielectric inner spacer between and physically contacting the first semiconductor layer and the second semiconductor layer; a gate stack comprising a portion between and physically contacting the first semiconductor layer and the second semiconductor layer; an air inner spacer; and a semiconductor region, wherein both of the dielectric inner spacer and the semiconductor region are exposed to the air inner spacer. In an embodiment, the air inner spacer comprises an inner portion extending into a space overlapping the first semiconductor layer. In an embodiment, the air inner spacer further comprises an outer portion vertically offset from the first semiconductor layer and the second semiconductor layer. In an embodiment, a first sidewall of the dielectric inner spacer exposed to the air inner spacer is concaved and rounded, and wherein a second sidewall of the semiconductor region exposed to the air inner spacer comprises two straight edges joined to each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a stack of layers comprising:
        a plurality of semiconductor nano structures; and
        a plurality of sacrificial layers, wherein the plurality of semiconductor nano structures and the plurality of sacrificial layers are arranged alternatingly;
    laterally recessing the plurality of sacrificial layers to form lateral recesses;
    forming inner spacers in the lateral recesses;
    after the inner spacers are formed, laterally recessing the plurality of semiconductor nano structures; and
    epitaxially growing a source/drain region from the plurality of semiconductor nano structures, wherein the source/drain region is spaced apart from the inner spacers by air inner spacers.

2. The method of claim 1, wherein the inner spacers have concaved outer sidewalls facing the air inner spacers.

3. The method of claim 1, wherein the air inner spacers extend into the lateral recesses.

4. The method of claim 1 further comprising:
    after the source/drain region is grown, removing the plurality of sacrificial layers; and
    forming a gate stack extending into spaces left by the plurality of sacrificial layers that have been removed.

5. The method of claim 1, wherein one of the air inner spacers extends into one of the inner spacers.

6. The method of claim 1, wherein the forming the inner spacers comprises:
    depositing a dielectric layer extending into the lateral recesses; and
    etching the dielectric layer, wherein remaining portions of the dielectric layer form the inner spacers.

7. The method of claim 1, wherein one of the air inner spacers has two end portions, and a middle portion wider than the two end portions.

8. The method of claim 7, wherein the end portions have a width substantially equal to zero.

9. The method of claim 1, wherein one of the inner spacers is exposed to, and is taller than, a corresponding one of the air inner spacers.

10. A method comprising:
    forming a gate stack, wherein the gate stack comprises portions separating a plurality of semiconductor nano structures from each other, wherein upper ones of the plurality of semiconductor nano structures overlap corresponding lower ones of the plurality of semiconductor nano structures;
    forming inner spacers separating the plurality of semiconductor nano structures from each other; and
    forming a source/drain region aside of the plurality of semiconductor nano structures, wherein air inner spacers are located between the source/drain region and the inner spacers, wherein in a cross-sectional view of the air inner spacers, one of the air inner spacers comprises two straight edges joined to each other.

11. The method of claim 10, wherein one of the air inner spacers is formed as extending to a space between an overlying one and an underlying one of the plurality of semiconductor nano structures.

12. The method of claim 10, wherein one of the air inner spacers is formed as separated from an overlying one or an underlying one of the plurality of semiconductor nano structures by a part of one of the inner spacers and a part of the source/drain region.

13. The method of claim 10, wherein one of the air inner spacers comprises:
    a first end portion and a second end portion; and
    a middle portion between, and being wider than, the first end portion and the second end portion.

14. The method of claim 10, wherein one of the inner spacers is formed as comprising a concave sidewall exposed to one of the air inner spacers.

15. The method of claim 10, wherein upper ones of the air inner spacers are formed as overlapping lower ones of the air inner spacers.

16. The method of claim 10, wherein one of the inner spacers is exposed to, and is taller than, a corresponding one of the air inner spacers.

17. A method comprising:
    a dielectric inner spacer between and physically contacting a first semiconductor layer and a second semiconductor layer, wherein the second semiconductor layer is over and vertically spaced apart from the first semiconductor layer;

forming a gate stack comprising a portion between and physically contacting the first semiconductor layer and the second semiconductor layer;

forming an air inner spacer, wherein a first sidewall of the dielectric inner spacer exposed to the air inner spacer is concaved and rounded; and forming a semiconductor region, wherein both of the dielectric inner spacer and the semiconductor region are exposed to the air inner spacer, wherein a second sidewall of the semiconductor region exposed to the air inner spacer comprises two straight edges joined to each other.

18. The method of claim 17, wherein the air inner spacer comprises an inner portion extending into a space overlapping the first semiconductor layer.

19. The method of claim 17, wherein the air inner spacer further comprises an outer portion vertically offset from the first semiconductor layer and the second semiconductor layer.

20. The method of claim 17, wherein the dielectric inner spacer is taller than the air inner spacer.

\* \* \* \* \*